(12) United States Patent
Li et al.

(10) Patent No.: US 10,874,020 B2
(45) Date of Patent: Dec. 22, 2020

(54) IMPRINTED METALLIZATION ON POLYMERIC SUBSTRATES

(71) Applicant: The University of Hong Kong, Hong Kong (CN)

(72) Inventors: Wendi Li, Hong Kong (CN); Jingxuan Cai, Guangdong (CN); Shien-Ping Feng, Hong Kong (CN); Mingyang Zhang, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 7 days.

(21) Appl. No.: 16/271,261

(22) Filed: Feb. 8, 2019

(65) Prior Publication Data

US 2020/0260590 A1 Aug. 13, 2020

(51) Int. Cl.
| | | |
|---|---|---|
| *B05D 1/00* | (2006.01) | |
| *H05K 3/18* | (2006.01) | |
| *H05K 1/09* | (2006.01) | |
| *H05K 1/02* | (2006.01) | |
| *H05K 3/38* | (2006.01) | |

(Continued)

(52) U.S. Cl.
CPC ......... *H05K 3/182* (2013.01); *C23C 18/1608* (2013.01); *G03F 7/0035* (2013.01); *H01B 5/14* (2013.01); *H01B 13/0036* (2013.01); *H05K 1/028* (2013.01); *H05K 1/09* (2013.01); *H05K 3/107* (2013.01); *H05K 3/381* (2013.01); *B82Y 20/00* (2013.01); *B82Y 40/00* (2013.01); *G02B 1/002* (2013.01); *H01B 1/02* (2013.01); *H01L 33/0083* (2013.01); *H01L 33/28* (2013.01); *H01L 33/42* (2013.01); *H01L 2933/0016* (2013.01); *H05K 1/189* (2013.01); *H05K 2201/0257* (2013.01); *H05K 2201/09681* (2013.01); *H05K 2201/10022* (2013.01); *H05K 2201/10106* (2013.01); *H05K 2201/10522* (2013.01); *H05K 2203/0121* (2013.01); *H05K 2203/072* (2013.01)

(58) Field of Classification Search
CPC .............................. B05D 1/00; C23C 18/1608
See application file for complete search history.

(56) References Cited

U.S. PATENT DOCUMENTS

| | | |
|---|---|---|
| 4,448,804 A | 5/1984 | Amelio et al. |
| 5,084,299 A | 1/1992 | Hirsch et al. |

(Continued)

OTHER PUBLICATIONS

Khan et al., Selective Electroless Metallization of Micro- and Nanopatterns via Poly(dopamine) Modification and Palladium Nanoparticle Catalysis for Flexible and Stretchable Electronic Applications, 2018, ACS Appl. Mater. Interfaces 2018, 10, 28754-28763. (Year: 2018).*

(Continued)

*Primary Examiner* — Hai Y Zhang
(74) *Attorney, Agent, or Firm* — Leydig, Voit & Mayer, Ltd.

(57) ABSTRACT

A method for selective metallization includes: selectively adsorbing catalytic nanoparticles onto an imprint mold to form a selectively adsorbed catalytic nanoparticle (SACN) mold; using the SACN mold in an imprinting process to synchronously transfer a pattern and the catalytic nanoparticles onto a film; separating the film from the SACN mold; and selectively depositing metal onto the film based on the pattern transferred to the film.

16 Claims, 17 Drawing Sheets

(51) Int. Cl.

| | |
|---|---|
| H01B 5/14 | (2006.01) |
| H01B 13/00 | (2006.01) |
| G03F 7/00 | (2006.01) |
| C23C 18/16 | (2006.01) |
| H05K 3/10 | (2006.01) |
| G02B 1/00 | (2006.01) |
| H05K 1/18 | (2006.01) |
| H01B 1/02 | (2006.01) |
| H01L 33/28 | (2010.01) |
| H01L 33/42 | (2010.01) |
| H01L 33/00 | (2010.01) |
| B82Y 40/00 | (2011.01) |
| B82Y 20/00 | (2011.01) |

(56) References Cited

U.S. PATENT DOCUMENTS

| | | | |
|---|---|---|---|
| 6,194,032 B1 | 2/2001 | Svedberg et al. | |
| 6,521,285 B1 | 2/2003 | Biebuyck et al. | |
| 2014/0072720 A1* | 3/2014 | Watkins | H01B 13/003 427/487 |

OTHER PUBLICATIONS

Park et al., "Copper Circuit Patterning on Polymer Using Selective Surface modification and electroless plating". *Applied Surface Science*, 396:1678-1684 (2017).

Cordonier et al., "Formation of Micrometer Scale Metal Structures on Glass by Selective Electroless Plating on Photopatterned Titanium and Copper Containing Films," *Langmuir*, 33(51): 14571-14579 (2017).

Hidber et al., "Microcontact Printing of Palladium Colloids: Micron-Scale Patterning by Electroless Deposition of Copper," *Langmuir*, 12: 1275-1380 (1996).

Kind et al., "Patterned Electroless Deposition of Copper by Microcontact Printing Palladium (II) Complexes on Titanium-Covered Surfaces," *Langmuir*, 16(16):6367-73 (Aug. 8, 2000).

Ma et al., "Electroless Copper Plating of Inkjet-Printed Polydopamine Nanoparticles: a Facile Method to Fabricate Highly Conductive Patterns at Near Room Temperature," *ACS Applied Materials & Interfaces*, 6(22):19494-8 (2014).

Shin, et al. "A Bioactive Carbon Nanotube-Based Ink for Printing 2D and 3D Flexible Electronics," *Adv. Mater.*, 28(17):3280-3289, 2016.

Su, et al., "Nanoparticle Based Curve Arrays for Multirecognition Flexible Electronics," *Adv. Mater.*, 28(7):1369-1374, Dec. 8, 2015.

Khan, et al., "Solution-Processed Transparent Nickel-Mesh Counter Electrode with in-Situ Electrodeposited Platinum Nanoparticles for Full-Plastic Bifacial Dye-Sensitized Solar Cells," *ACS Appl. Mater. Interfaces* (9)9:8083-8091, 2017.

Yu, et al., "Silver Nanowire-Polymer Composite Electrodes for Efficient Polymer Solar Cells," *Adv. Mater.*, 23(38):4453-4457, 2011.

Wu, et al., "Organic Light-Emitting Diodes on Solution-Processed Graphene Transparent Electrodes", *ACS Nano* 2010, 4(1):43-48, Nov. 10, 2009.

Wang, et al., "Rod-Coating: Towards Large-Area Fabrication of Uniform Reduced Graphene Oxide Files for Flexible Touch Screens", *Adv, Mater.*, 24(21):2874-2878, Jun. 5, 2012.

Deb, S.K., et al. "Stand-alone photovoltaic-powered electrochromic smart window", *Electrochimica Acta*, vol. 46, Issues 13-14, pp. 2125-2130, Apr. 2, 2001.

Gong, S.H, et al. "Fabrication of Highly Transparent and Flexible NanoMesh Electrode via Self-assembly of Ultrathin Gold Nanowires", *Adv. Electron Mater.*, 2016, 2, 1600121.

Ko, S.H., et al., "All-inkjet-printed flexible electronics fabrication on a polymer substrate by low-temperature high-resolution selective laser sintering of metal nanoparticles", *Nanotechnology*, 18(34):1-8, 2007.

Kang, J.S., et al., "Inkjet Printed Electronics Using Copper Nanoparticle Ink", *Journal of Materials Science: Materials in Electronics*, 21(21):1213-1220, Nov. 2010.

Chang, Y., et al., "Preparation, characterization and reaction mechanism of a novel silver-organic conductive ink", *Journal of Materials Chemistry*, 2012, 22, 25296-25301.

Tai, Y.L., et al., "Fabrication of paper-based conductive patterns for flexible electronics by direct-writing", *Journal of Materials Chemistry*, 2011, 21, 5938-5943.

Kanninen, P., et al., "Influence of ligand structure on the stability and oxidation of copper nanoparticles", *Journal of colloid and interface science*, 2008, 318, pp. 88-95.

Khan, A., et al., "High-Performance Flexible Transparent Electrode with an Embedded Metal Mesh Fabricated by Cost-Effective Solution Process", Small-Journal.com, 2016, 12, pp. 1-10.

Cia, J., et al. "Selective Electroless Metallization of Micro- and Nanopatterns via Poly(dopamine) Modification and Palladium Nanoparticle Catalysis for Flexible and Stretchable Electronic Applications", *ACS Appl. Mater. Interfaces*, 2018, 10, 28754-28763.

Kao, C.Y. et al., "Electroless Copper Plating onto Printed Lines of Nanosized Silver Seeds", *Electrochem. Solid State Lett.*, 2007,10, D32-D34.

Liao, Y.C., et al., "Direct Writing Patterns for Electroless Plated Copper Thin Film on Plastic Substrates", *ACS Appl. Mater. Interfaces*, 2012, 4(10):5109-5113.

Yang, G.H., et al., "Surface Graft Copolymerization of Poly (tetrafluoroethylene) Films with N-Containing Vinyl Monomers for the Electroless Plating of Copper", *Langmuir*, 2001, 17(1):211-218.

Liu, Z.C., et al. "Electroless plating of copper through successive pretreatment with silane and colloidal silver", Colloids and Surfaces A: Physicochemical and Engineering Aspects, 2005, 257-57, 283-286.

Guo, T.F., et al. "Vertically Integrated Electronic Circuits via a Combination of Self-Assembled Polyelectrolytes, Ink-Jet Printing, and Electroless Metal Plating Processes", *Langmuir*, 2002, 18, 8142-8147.

Chang, Y., et al. "Fabrication of Copper patterns on Flexible Substrate by Patterning Adsorption-Plating Process", *Appl. Mater, Interfaces*, 2014, 6, 768-772.

Hu, M.J. et al., "SU-8-Induced Strong Bonding of Polymer Ligands to Flexible Substrates via in Situ Cross-Linked Reaction for Improved Surface Metallization and Fast Fabrication of High-Quality Flexible Circuits", *ACS Appl. Mater. Interfaces*, 2016, 8, 4280-4286.

Jin, Y.X., et al., "Site-Selective Growth of Patterned Silver Grid Networks as Flexible transparent Conductive Film by Using Poly(dopamine) at Room Temperature", *ACS Appl. Mater,. Interfaces*, 2014, 6(3):1447-1453.

Groep, van de, J.V., et al., "Transparent Conducting Silver Nanowire Networks", *Nano Lett.*, 2012, 12(6):3138-3144.

Vosgueritchian, M., et al., "Highly Conductive and Transparent PEDOT:PSS Films with a Fluorosurfactant for Stretchable and Flexible Transparent Electrodes", *Adv. Funct. Mater.*, 2012, 22(2):421-428.

Han, B., et al., "Uniform Self-Forming Metallic Network as a High-Performance Transparent Conductive Electrode", *Adv. Mater.*, 2014, 26, 876-877.

Knickerbocker, S.A., et al., "Calculation of the figure of merit for indium tin oxide films based on basic theory", *J. Vac. Sci. Technol., A.*, 1995, 13, 1048-1052.

Yoon, Y. H., et al., "Transparent film heater using single-walled carbon nanotubes", *Adv. Mater.* 2007, 19(23); 4284-4287.

Jang, H.S., et al., "The manufacture of a transparent film heater by spinning multi-walled carbon nanotubes", *Carbon*, 2011, 49, 111-116.

Kang, J., et al., "High-Performance Graphene-Based Transparent Flexible Heaters", *Nano Letters*, 2011, 11(12):5154-5158.

Sui, D., et al., "Flexible and Transparent Electrothermal Film Heaters Based on Graphene Materials", *Small*, 2011, 7(22):3186-3192.

Celle, C., et al. "Highly Flexible Transparent Film Heaters Based on Random Networks of Silver Nanowires", *Nano Research.*, 2012, 5(6):427-433.

(56) References Cited

OTHER PUBLICATIONS

Hong, S., et al., "Nonvacuum, Maskless Fabrication of a Flexible Metal Grid Transparent Conductor by Low-Temperature Selective Laser Sintering of Nanoparticle Ink", *ACS Nano*, 2013; 7(6):5024-5031.

Kim, T., et al., "Uniformly Interconnected Silver-Nanowire Networks for Transparent Film Heaters", *Adv. Funct. Mater.*, 2013, 23(10):1250-1255.

Gupta, R., et al., "Spray Coating of Crack Templates for the Fabrication of Transparent Conductors and Heaters on Flat and Curved Surfaces", *ACS Appl. Mater. Interfaces*, 2014, 6(16):13688-13696.

Huang, Q., et al., "Highly Flexible and Transparent Film Heaters Based on Polyimide Films Embedded with Silver Nanowires", *RSC Advances*. 2015, 5(57):45836-45842.

Gupta, R., "Visibly Transparent Heaters", *Appl. Mater. Interfaces*, 2016, 8(20):12559-12575.

Cai, J., et al., "Highly transparent and flexible polyaniline mesh sensor for chemiresistive sending of ammonia gas" *Royal Society of Chemistry, RSC Advances*, 2018, 8:5312-5320.

Jeong, S., et al. "Controlling the Thickness of Surface Oxide Layer on Cu Nanoparticles for the Fabrication of Conductive Structures by Ink-Jet Printing", *Advanced Functional Materials*, 2008, 18, 679-286.

Fernando, L., et al., "Brain Computer Interfaces, a Review", *Sensors*, 2012, 12, 1211-1279.

* cited by examiner

IMPRINTED METALLIZATION ON POLYMERIC SUBSTRATES

BACKGROUND

Flexible electronics and optoelectronics have been attracting increasing research interest because of their promising applications in many practical fields, such as wearable electronics, medical implants, portable devices, to name a few. Flexible devices (such as solar cells, light-emitting diodes, touch panels, and smart windows, etc.) rely on the evolving of flexible conductive metallic micro- and nanopatterns. An aspect to such applications is the fabrication of metallic micro- and nanopatterns on flexible insulating substrates. Cost-effective and high-quality fabrication of these flexible and stretchable conductive components, which contain multi-scale features of continuous metals on plastic substrates, remains a challenge in the prior art.

The most commonly used approach in the flexible printed circuit industry is based on a lithography and etching process, which wastes materials and is expensive, pollutant, and complicated. New techniques that overcome such limitations have been investigated. One of the most intensively studied method is inkjet printing of metallic nanoparticles ink. However, this process often hindered by the low conductivity of the metallic nanoparticles ink compared with bulk metals and oxidation of the metallic nanoparticles. Another candidate for fabrication of metallic patterns on plastic substrates is based on the combination of three well-developed techniques, i.e., lithography, electroplating and imprint-transfer. However, the electroplating process used in this technique requires a patterned intermediate conductive substrate as the electroplating template followed by transfer to plastic substrates, which increases production complexity and cost.

Selective electroless plating (ELP) of metals, which relies on an autocatalytic redox reaction to deposit a thin-layer metal on a catalyst-preloaded substrate, has been explored. The conductivity of the electroless plated metal can reach the same level as bulk metal. However, as an open problem, it is known that untreated flexible plastics cannot well grasp catalyst due to the lack of binding sites, and simple physical adsorption often leads to the diffusion of the catalyst and poor adhesive strength of the deposited metals. Practically, modification of bare plastic surfaces to enhance catalyst adsorption and improve the adhesion of the deposited metal would be necessary, and numerous efforts have been devoted to the development of selective ELP on flexible plastics. For example, selective ELP on flexible substrates has been demonstrated through polymer grafting, surface silanization, the deposition of polyelectrolytes, inkjet printing of ion-adsorption nanoparticles, laser printing of poly(4-vinylpridine), and patterning of catalyst-adsorption layer. However, all of these methods rely on chemical modification of plastic surfaces, and such surface modification processes are expensive, complicated, and processed under harsh conditions (in volatile organic solvents). Therefore, selective ELP techniques are not currently considered a viable alternative for conventional lithography and etching processing.

SUMMARY

In an exemplary embodiment, the present invention provides a method for selective metallization. The method includes: selectively adsorbing catalytic nanoparticles onto an imprint mold to form a selectively adsorbed catalytic nanoparticle (SACN) mold; using the SACN mold in an imprinting process to synchronously transfer a pattern and the catalytic nanoparticles onto a film; separating the film from the SACN mold; and selectively depositing metal onto the film based on the pattern transferred to the film.

In another exemplary embodiment, the present invention provides a flexible electronic apparatus. The flexible electronic apparatus includes: a film having imprinted trenches forming a pattern, wherein the imprinted trenches include catalytic nanoparticles disposed at surfaces of the imprinted trenches; and metal disposed within the imprinted trenches.

In yet another exemplary embodiment, the present invention provides an imprint mold. The imprint mold includes: a glass backbone; a metal layer forming an imprint pattern, the metal layer comprising metal which is adsorptive relative to catalytic nanoparticles; and a resin interlayer disposed between the glass backbone and the metal layer, wherein the resin interlayer is repellent relative to the catalytic nanoparticles.

BRIEF DESCRIPTION OF THE DRAWINGS

FIG. 17 depicts: (a) a photograph of an exemplary flexible printed circuit (FPC) for a 3×3 light-emitting diode (LED) array in accordance with an exemplary implementation of the invention; and (b) a photograph of the FPC from part (a) of FIG. 17 with resistors and LEDs welded thereon, with one of the LEDs being powered on.

DETAILED DESCRIPTION

Exemplary embodiments of the invention provide for selective electroless metallization on insulators based on an imprint transfer of catalytic nanoparticles. In an exemplary embodiment, an imprint mold having a glass backbone, a palladium nanoparticle (PdNP)-repellent resin interlayer, a nickel pattern carrying micropatterning or nanopatterning information, and selectively adsorbed catalytic nanoparticles (SACN), referred to herein as an "SACN-mold," is utilized to synchronously transfer the micropattern or nanopattern as well as PdNPs onto thermoplastic substrates with high patterning resolution (e.g., down to hundreds of nanometers) without any pretreatment on the plastic substrates. An electroless deposition process is then employed to selectively deposit metal inside the PdNP-activated imprinted patterns. Because the PdNPs were fully embedded in the plastic substrates, electroless deposited metals were firmly attached to the substrates, which provides excellent mechanical stability for the corresponding electronic devices based thereon.

Unlike existing metallization methods which rely on complicated and expensive lithographic and etching processes, or physically and chemically modifying insulator surfaces which weaken the mechanical and electrical properties of the insulators, to grasp catalytic nanoparticles, exemplary embodiments of the invention utilize an SACN mold to transfer both the pattern and the catalytic nanoparticles to the insulators without any pretreatment on the insulators, which significantly reduces fabrication complexity. Further, unlike existing methods which have problems with adhesion between the plated metal and the substrate, exemplary embodiment of the invention have catalytic nanoparticles fully embedded in the substrate such that the adhesion force between the electroless plated metal and the substrate is greatly enhanced.

Exemplary embodiments of the invention provide a process for fabrication of metallic patterns in electrical and electronic manufacturing, and are applicable to the flexible printed circuit (FPC) industry. Exemplary embodiments of the invention include: (1) an SACN mold with selectively adsorbed catalytic nanoparticles; (2) imprint-based transfer of catalytic nanoparticles to flexible substrate; and (3) electroless plating of metallic circuitry patterns embedded in polymeric substrates.

Figure 1:
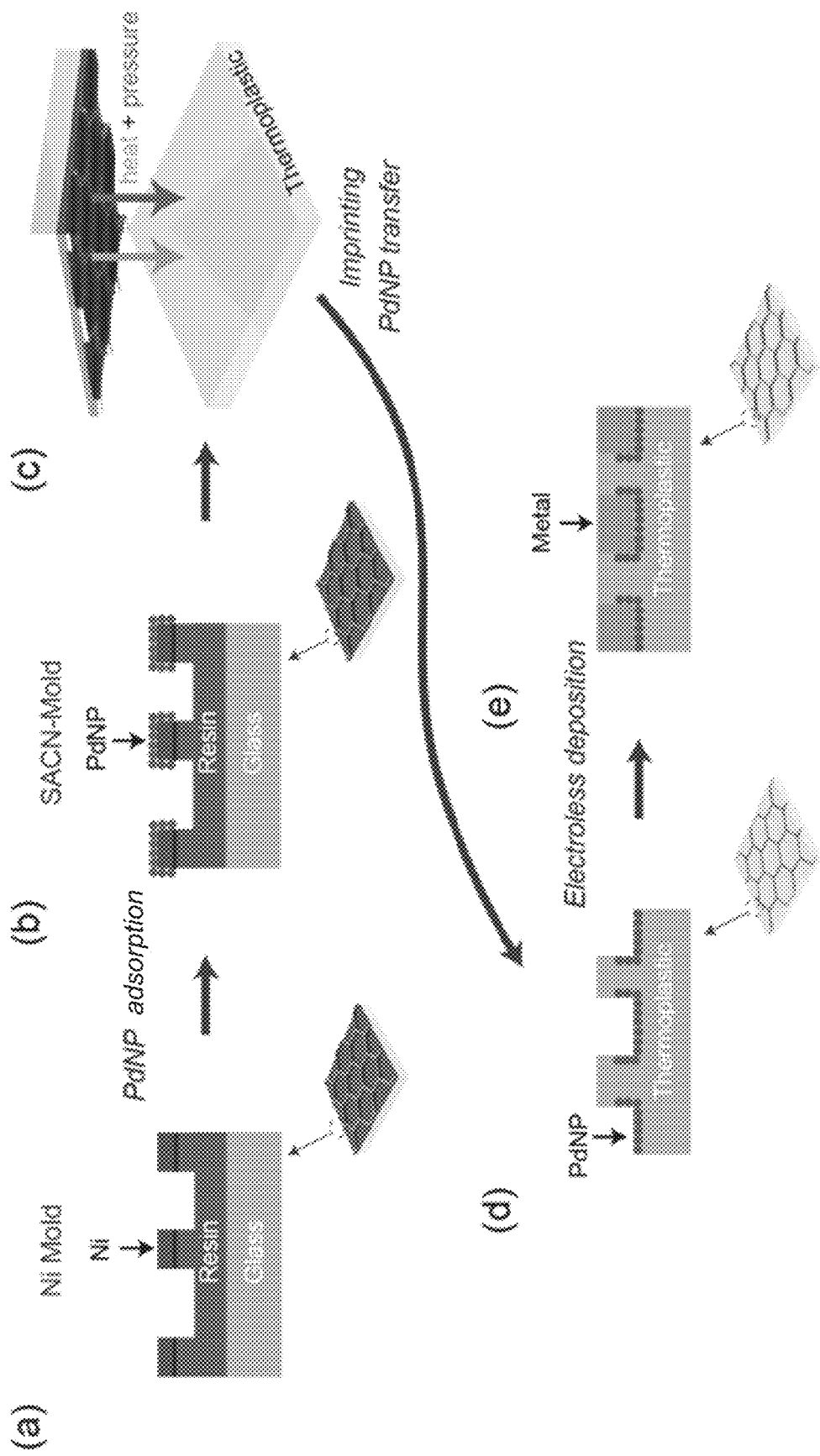
FIG. 1 depicts an exemplary process for selective metallization of microscale and/or nanoscale structures based on transfer patterning of PdNPs onto thermoplastics adapted from thermal nanoimprint lithography and electroless deposition of metals on the PdNPs-activated area.

In an exemplary embodiment, the invention provides for selective metallization of microscale and/or nanoscale structures based on transfer patterning of catalytic nanoparticles (e.g. PdNPs, platinum nanoparticles, silver nanoparticles, nickel nanoparticles, Ni—Co nanoparticles, etc.) onto a film (e.g., made of thermoplastics adapted from thermal nanoimprint lithography or other materials that can be deformed to replicate the shape of a mold) and electroless deposition of metals on the PdNPs-activated area. FIG. 1 depicts an exemplary implementation of this exemplary embodiment. Part (a) of FIG. 1 depicts an imprint mold having a glass backbone, a resin interlayer, and a pattern (e.g., a microscale mesh pattern or nanoscale nanodisk array, or any other arbitrary pattern such as square patterns, hexagon patterns, triangle patterns, random patterns, or circuitry patterns) having catalytic nanoparticle adsorption layer (e.g., comprising material that is able to attach catalytic nanoparticles and with chemical inertia in electroless plating solution such as Ni, Au, Cr, or Zn, or certain polymers or dielectrics such as $SiO_2$ having appropriately modified surfaces for providing adhesion to the catalytic nanoparticles) on top. In an exemplary implementation where the catalytic nanoparticles are PdNPs and the catalytic nanoparticle adsorption layer comprises Ni, the imprint mold undergoes a PdNP adsorption process to become an SACN mold and carries both the pattern for imprinting and the PdNPs. The PdNP adsorption process may include, for example, immersion of the imprint mold in a 300 nM PdNPs solution (having 13-nm diameter PVP-capsuled PdNPs) at 40° C. for 300 second, or spraying or brush coating of PdNPs solution on the imprint mold, which causes PdNPs to be selectively adsorbed on the Ni surfaces of the imprint mold rather than the resin surfaces of the imprint mold. This is due to Ni having a high affinity to the PdNPs, whereas the resin interlayer (which may comprise, for example, fluorine-containing resin, UV-curable resin (e.g., NOA-61, Norland Products, USA) or thermal-curable resin) has low surface energy and is thus PdNP-repellent. The SACN mold is depicted in part (b) of FIG. 1.

The SACN mold is then used for an imprinting process as shown in part (c) of FIG. 1, in which the SACN mold is used to synchronously transfer both the pattern and the PdNPs onto a film (e.g., a thermoplastic film), for example, using a thermal imprinting process (which applies heat and pressure). After cooling down the stack to a demolding temperature, the thermoplastic film is peeled off (e.g., manually) from the SACN mold, with the pattern transferred and the PdNPs firmly embedded in the trenches corresponding to the pattern (which may enhance the adhesive strength of PdNPs with the substrate), as shown in part (d) of FIG. 1. Thereafter, metal is selectively deposited into the PdNP-activated trenches as shown in part (e) of FIG. 1 to form a metallic pattern, for example, by immersing the film in various electroless plating baths. The film may then be rinsed in deionized water and be stored, for example at 60° C. for 30 min, to release internal stress and further enhance the adhesion of the deposited metal.

In other exemplary implementations, instead of using a thermal imprinting process, a roll-to-roll imprinting process, a roll-to-plate imprinting process, a step-and-repeat imprinting process, or a UV-curable resin imprinting process may be used. If using a UV-curable resin, the SACN-mold is pressed into the resin precursor (e.g. in liquid form), and then UV light exposes and cures the resin. Then, the SACN-mold is separated from the cured resin and the nanoparticles are left in the imprinted structures on the cured resin.

Figure 2:
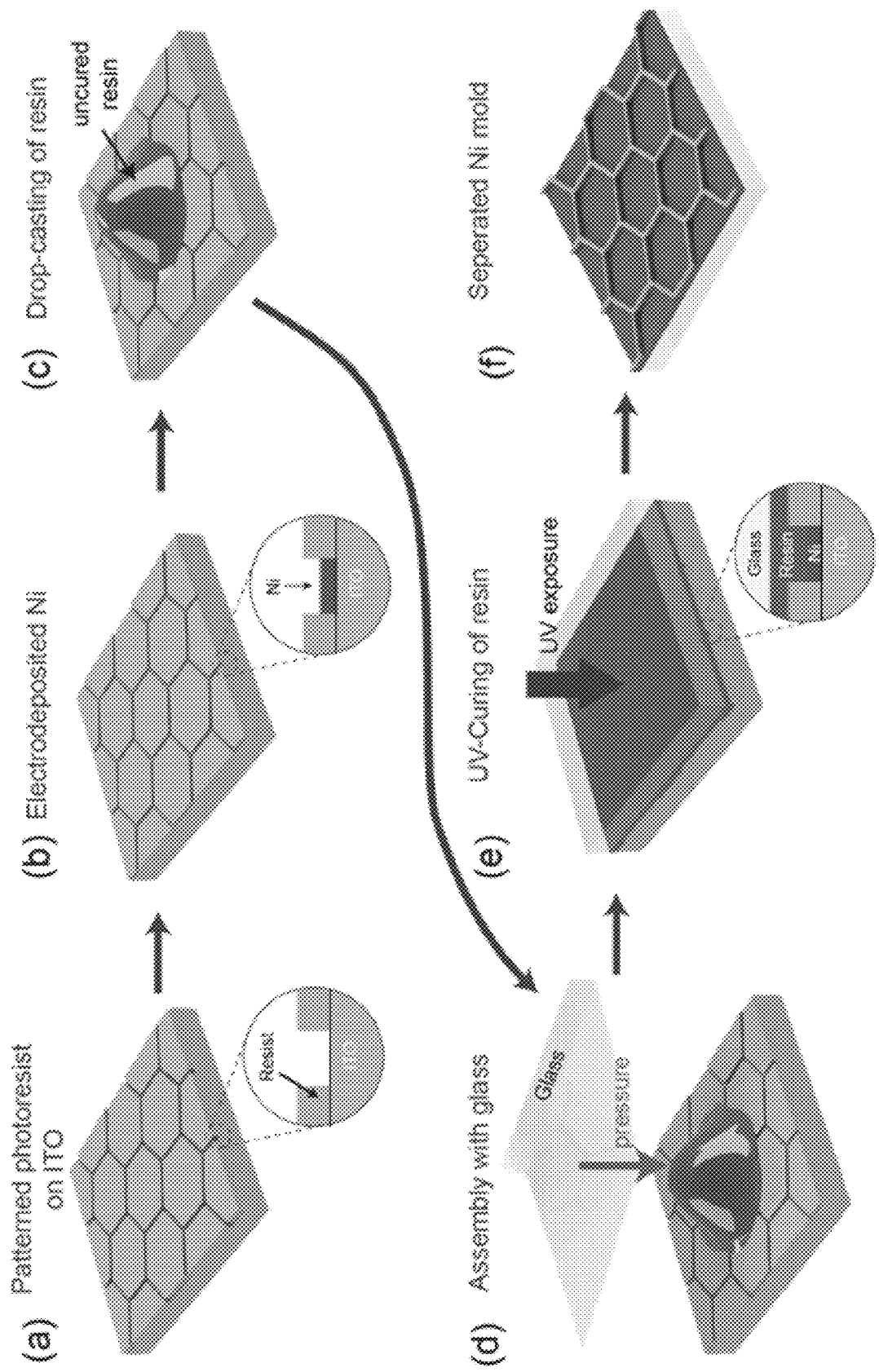
FIG. 2 depicts an exemplary fabrication process for the imprint mold depicted in part (a) of FIG. 1.

FIG. 2 depicts an exemplary fabrication process for the imprint mold depicted in part (a) of FIG. 1. Part (a) of FIG. 2 shows a film (e.g., photoresist) being coated (e.g., spin-coated) onto a glass substrate (e.g., a conductive ITO glass substrate), and a lithographic process being used to generate a microscale or nanoscale pattern in the film (e.g., using UV exposure and development, nanoimprinting, scanning beam lithography or direct laser writing). Part (b) of FIG. 2 shows Ni being electrodeposited inside the lithographically-defined trenches so as to fill the trenches with a uniform Ni layer. Parts (c) and (d) of FIG. 2 show a UV-curable or thermal-curable resin being coated (e.g., via drop-casting, spray coating, blade coating or spin-coating) onto the Ni-plated ITO substrate and covered by a glass substrate with pressure to form the resin interlayer between the Ni layer and the glass substrate of the imprint mold. Part (e) of FIG. 2 shows the resin being exposed to UV (or heat) until the resin is fully cured. The mold is then separated (e.g., manually) from the conductive ITO glass substrate and patterned photoresist (the adhesion between resin and metal and between resin and glass is much stronger than the adhesion between resin and photoresist), leaving the imprint mold shown in part (f) of FIG. 2. The imprint mold may then be baked, for example at 130° C. for 5 minutes, before use to further increase the Ni adhesion and to harden the resin.

By utilizing environmentally-friendly materials (e.g., palladium nanoparticle catalyst) and by relying on the processes described herein, exemplary embodiments of the invention are able to significantly reduce wastage of materials and generation of pollutants, to simplify the fabrication process, and to reduce fabrication costs. Further, because the electroless plated metal structures described herein are self-anchored in the substrate, which provides for greatly enhanced adhesion and overcomes the shortcomings in conventional electroless plating methods.

Figure 17:
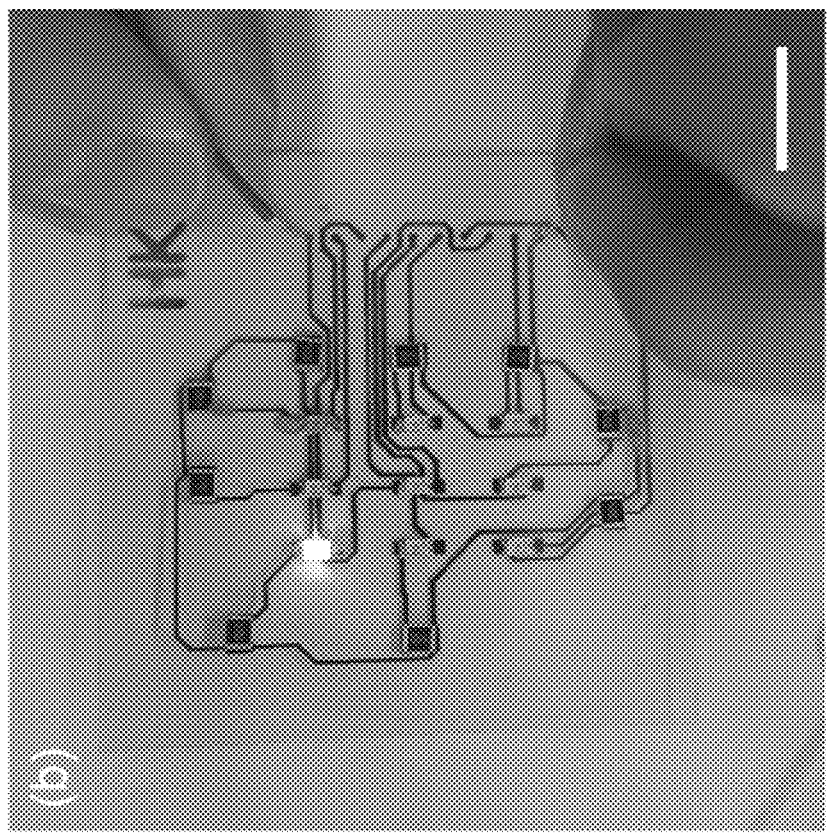
Figure 17:
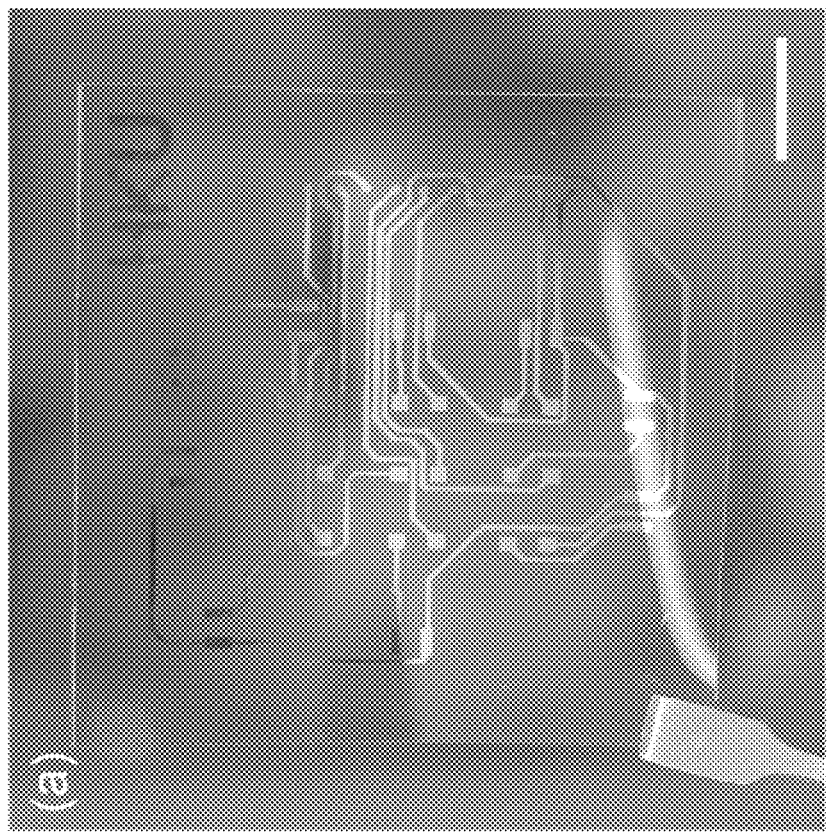

In certain exemplary implementations, the processes described herein were used to produce flexible transparent electrodes, as well as functional flexible printed circuits. FIG. 17 depicts: (a) a photograph of an exemplary flexible printed circuit (FPC) for a 3×3 light-emitting diode (LED) array in accordance with an exemplary implementation of the invention; and (b) a photograph of the FPC from part (a) of FIG. 17 with resistors and LEDs welded thereon, with one of the LEDs being powered on via an external microcontroller. Devices fabricated according to exemplary embodiments of the invention have been demonstrated as providing very high performance and environmental stability relative to conventional devices.

It will be appreciated that the metallization procedure described herein may be used for flexible insulators for flexible printed circuits, as well as other conductive metallic patterns used in electronic devices, and is characterized by high efficiency, low cost, and excellent mechanical stability of the metal layer. Exemplary embodiments of the invention are also applicable to other types of devices and components, such as transparent electrodes, sensors and solar cells.

An appendix is provided in the following paragraphs which provides additional details regarding certain exemplary implementations of the invention.

While the invention has been illustrated and described in detail in the drawings and the description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

APPENDIX

Highly-Facile Template-Based Selective Electroless Metallization of Micro- and Nanopatterns for Plastic Electronics and Plasmonics Abstract The authors reported a facile, scalable, high-yield, universal fabrication approach for micro- and nanoscale metallic patterns for flexible electronic and plasmonic applications, through imprint-transfer of catalytic Pd nanoparticles using a reusable imprint mold with selectively adsorbed catalytic nanoparticles, and selective electroless deposition of metals. Metallic patterns are mass-produced on flexible plastics according to the predefined micro-/nanofeatures on the imprint mold without any chemical modification on the substrate, which significantly reduces both fabrication cost and environmental pollutions, comparing to other methods utilizing electroless deposition. Excellent dimensional scalability and material versatility of this method have been confirmed by fabricating metallic micromeshes with a linewidth down to 3 µm, and metallic nanodisk arrays with a pitch of 500 nm. Using this method, flexible transparent electrodes were constructed on Cu micromesh-patterned plastic films with transmittance values higher than 75% and sheet resistance values below 0.4 ohm $sq^{-1}$, as well as high figures of merit up to $4\times10^3$. This method is further demonstrated in the fabrication of flexible thin-film heaters, electroluminescent displays, and flexible printed circuits, as well as plasmonic refractometric sensors.

1. Introduction

Recently, flexible electronics and optoelectronics have been attracting increasing research interest because of their promising applications in many practical fields, such as wearable electronics, medical implants, portable devices, to name a few. Novel flexible devices such as solar cells, light-emitting diodes, touch panels, and smart windows etc. rely on the evolving of flexible conductive metallic micro- and nanopatterns. Key to such applications is the fabrication of metallic micro- and nanopatterns on flexible substrates. Cost-effective and high-quality fabrication of these flexible and stretchable conductive components, which contain multi-scale features of continuous metals on plastic substrates, is of great importance but still remains challenging. For example, the most commonly used approach in flexible printed circuit industry is based on lithography and etching process, which wastes materials and is expensive, pollutant, and complicated. New techniques that overcome such limitations have been investigated. One of the most intensively studied method is inkjet printing of metallic nanoparticles ink. However, this process often hindered by the low conductivity of the metallic nanoparticles ink compared with bulk metals and oxidation of the metallic nanoparticles. Another candidate for fabrication of metallic patterns on plastic substrate is based on the combination of three well-developed techniques, i.e., lithography, electroplating and imprint-transfer. Such technique has been proven to be successful for fabrication of high-performance micro-mesh transparent electrodes (TEs) and transparent polyaniline mesh chemiresistive ammonia gas sensor. However, the electroplating process used in this technique requires a patterned intermediate conductive substrate as the electroplating template and then transferred to the plastic substrates, which inevitably increases production complexity and cost.

Selective electroless deposition (ELD) of metals, which relies on an autocatalytic redox reaction to deposit a thin-layer metal on a catalyst-preloaded substrate, has been explored and demonstrated its potentials to overcome these shortcomings. The conductivity of the electroless plated metal can reach the same level of the bulk metal. However, as an open problem, it is known that untreated flexible plastics cannot well grasp catalyst due to the lack of binding sites, and simple physical adsorption often leads to the diffusion of the catalyst and poor adhesive strength of the deposited metals. Practically, the modification of the bare plastic surfaces to enhance the catalyst adsorption and improve the adhesion of deposited metal is necessary, and numerous efforts have been devoted to the development of selective ELD on flexible plastics. For example, the selective ELD on flexible substrates has been demonstrated through polymer grafting, surface silanization, the deposition of polyelectrolytes, inkjet printing of ion-adsorption nanoparticles, laser printing of poly(4-vinylpridine), and patterning of catalyst-adsorption layer. However, all of these methods rely on the chemical modification of plastic surfaces, and the surface modification processes are usually expensive, complicated, and processed under harsh environment (in volatile organic solvents). Therefore, significant progresses in the selective ELD techniques must be done before it can be considered as a potential alternative for the conventional lithography and etching process.

In this research, an environment-friendly and cost-effective metallization approach on thermoplastics by imprint-transfer of catalytic palladium nanoparticles (PdNPs) and electroless plating for mass production of metallic micro-/nanopatterns were proposed and experimentally demonstrated. An imprint mold consisting of a glass backbone, a PdNP-repellent resin interlayer, a nickel pattern carrying micro-/nanopatterning information, and selectively adsorbed catalytic nanoparticles (SACN), termed SACN-mold, is employed to synchronously transfer the micro-/nanopattern as well as PdNPs onto thermoplastic substrates with high patterning resolution down to hundreds of nanometers without any pretreatment on the plastic substrates. An electroless deposition process is then employed to selectively deposit metal inside the PdNP-activated imprinted patterns. Because the PdNPs were fully embedded in the plastic substrates, electroless deposited metals were firmly attached to the substrates, which provides excellent mechanical stability for the electronic devices based on them. Flexible TEs with Cu micromeshes were fabricated on flexible substrates using this method, demonstrating excellent optical, electrical, mechanical and chemical performances. Thin-film heaters, flexible electroluminescent displays, and FPCs were constructed on flexible substrates using the proposed method to demonstrate the practical potentiality and versatility in the fabrication of electronic and optoelectronic devices. Moreover, 500-nm-pitch Ag nanodisk arrays were realized on the flexible substrate and investigated as plasmonic refractometric sensing platform to demonstrate the versatility of the method in patterning metallic structures.

Figure 3:
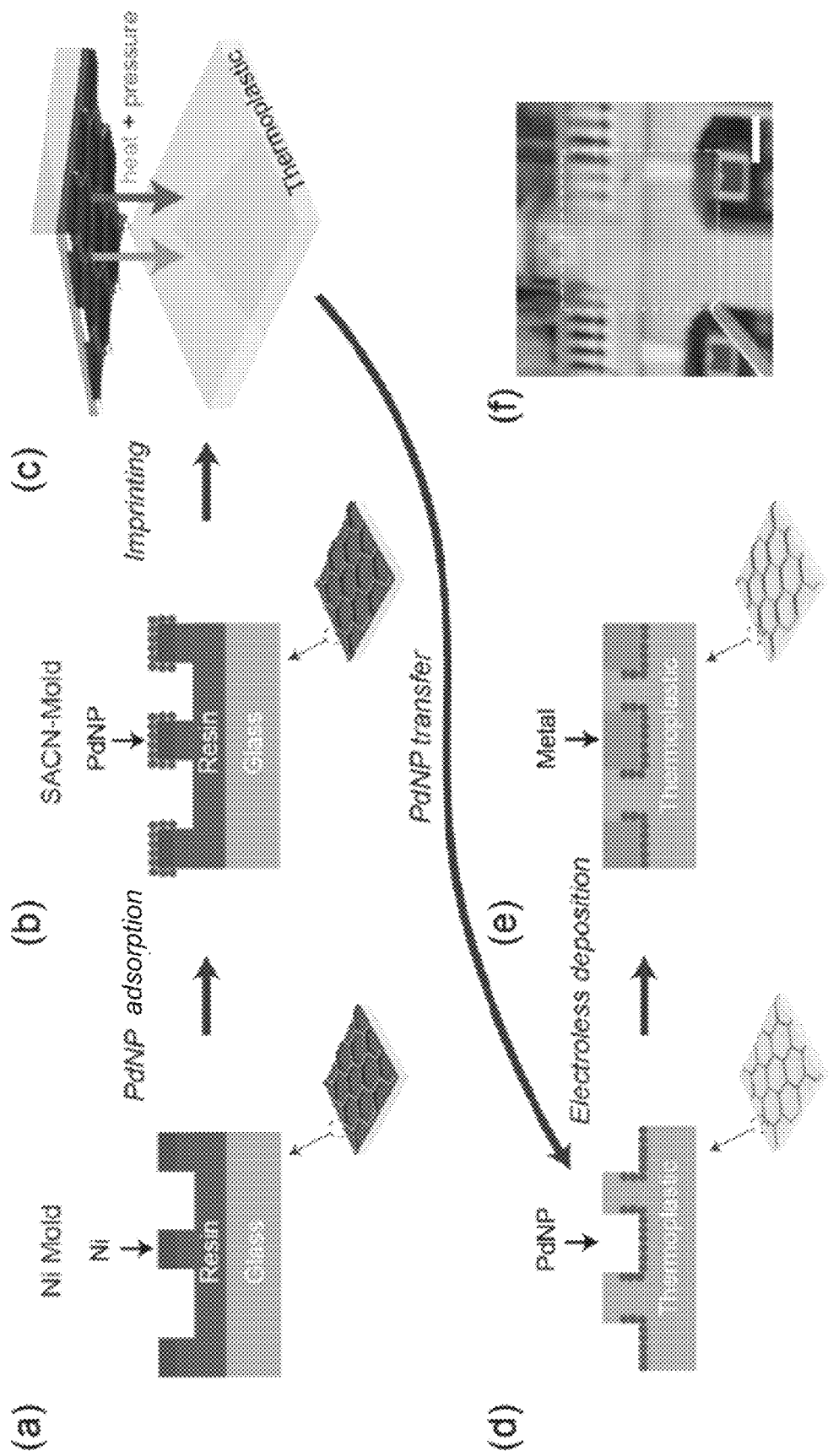
FIG. 3 is a schematic illustration of the fabrication of a metallic micromesh pattern using a SACN-mold. (a) An imprint mold consisting of a glass backbone, a resin interlayer, and a nickel mesh pattern. (b) PdNPs selectively adsorbed on the nickel-mesh surface to form the SACN-mold. (c) Synchronous transfer of PdNPs mesh pattern by thermal imprint. (d) Peeling off thermoplastic film with patterned PdNPs embedded. (e) Selective electroless deposition of metal in the trenches catalyzed by PdNPs. (f) Photograph of a 50 μm pitch Cu mesh on PET film. The scale bar represents 1 cm.
Figure 4:
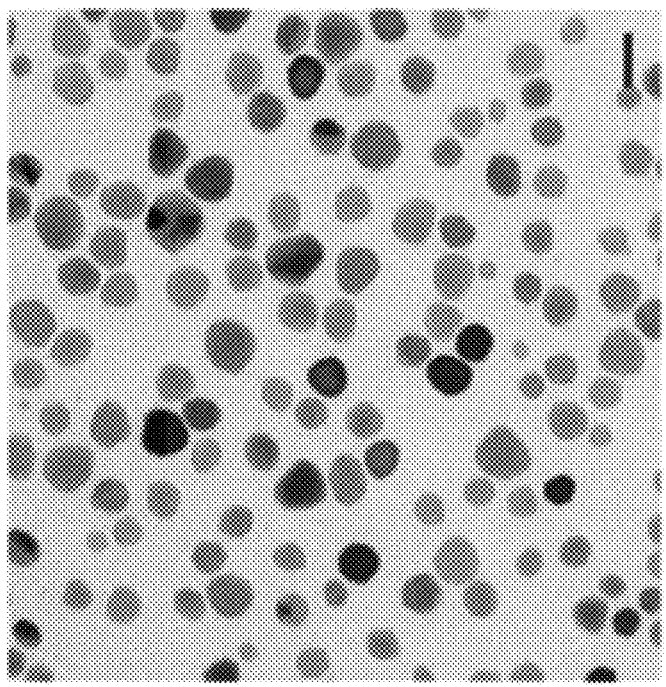
FIG. 4 is a tunneling electron microscopy (TEM) image of the catalytic palladium nanoparticles (PdNPs). The scale bar represents 20 nm.

2. Results and Discussion 2.1 Imprint-Transfer Patterning of PdNPs for Electroless Metallization of Micro- and Nanoscale Structures The facile and scalable metallization of micro- and nanoscale structures was achieved by a combination of two fabrication processes, including transfer patterning of PdNPs onto thermoplastics adapted from thermal nanoimprint lithography and electroless deposition of metals on the PdNPs-activated area. The fabrication process is schematically described in FIG. 3. A Ni mold consisting of a glass backbone, a resin interlayer, and a nickel-mesh pattern is employed as the carrier of both the pattern and PdNPs during SACN process (part (a) of FIG. 3). After immersion in a 300 nM PdNPs solution (consisting of 13-nm diameter PVP-capsuled PdNPs, see FIG. 4 for a TEM image) at 40° C. for 300 seconds, PdNPs were selectively adsorbed on the nickel-mesh surfaces rather than resin surfaces because of the hydrophobicity of the resin, which leads to a SACN-mold for following imprinting process (part (b) of FIG. 3). Thereafter, the SACN-mold was used to synchronously transfer both the mesh-pattern and PdNPs onto a thermoplastic film using a thermal imprinting process (part (c) of FIG. 3). After cooling down the stack to the demolding temperature, the thermoplastic film was manually peeled off from the SACN-mold, with mesh-pattern transferred and PdNPs firmly embedded in the trenches of the mesh, which could potentially enhance the adhesive strength of PdNPs with the substrate. (part (d) of FIG. 3). Thereafter, metals were selectively deposited on the PdNP-activated trenches to form a uniform metallic pattern by immersing the film in various electroless plating baths (part (e) of FIG. 3). Finally, the film was rinsed in deionized water and stored at 60° C. for 30 min to release the internal stress and further enhance the adhesion of the deposited metal layer. A Cu micromesh was fabricated on a 200-μm-thick polyethylene terephthalate (PET) film through this process as a demonstration and shows excellent uniformity and transparency (part (f) of FIG. 3). The entire fabrication process is solution-based, performed in the ambient environment and suitable for large-area fabrication. Additionally, this process can be readily standardized and used during industrial production.

2.2 Fabrication of the Imprint Mold for Selectively Adsorption of Catalytic Nanoparticles (SACN)

Figure 5:
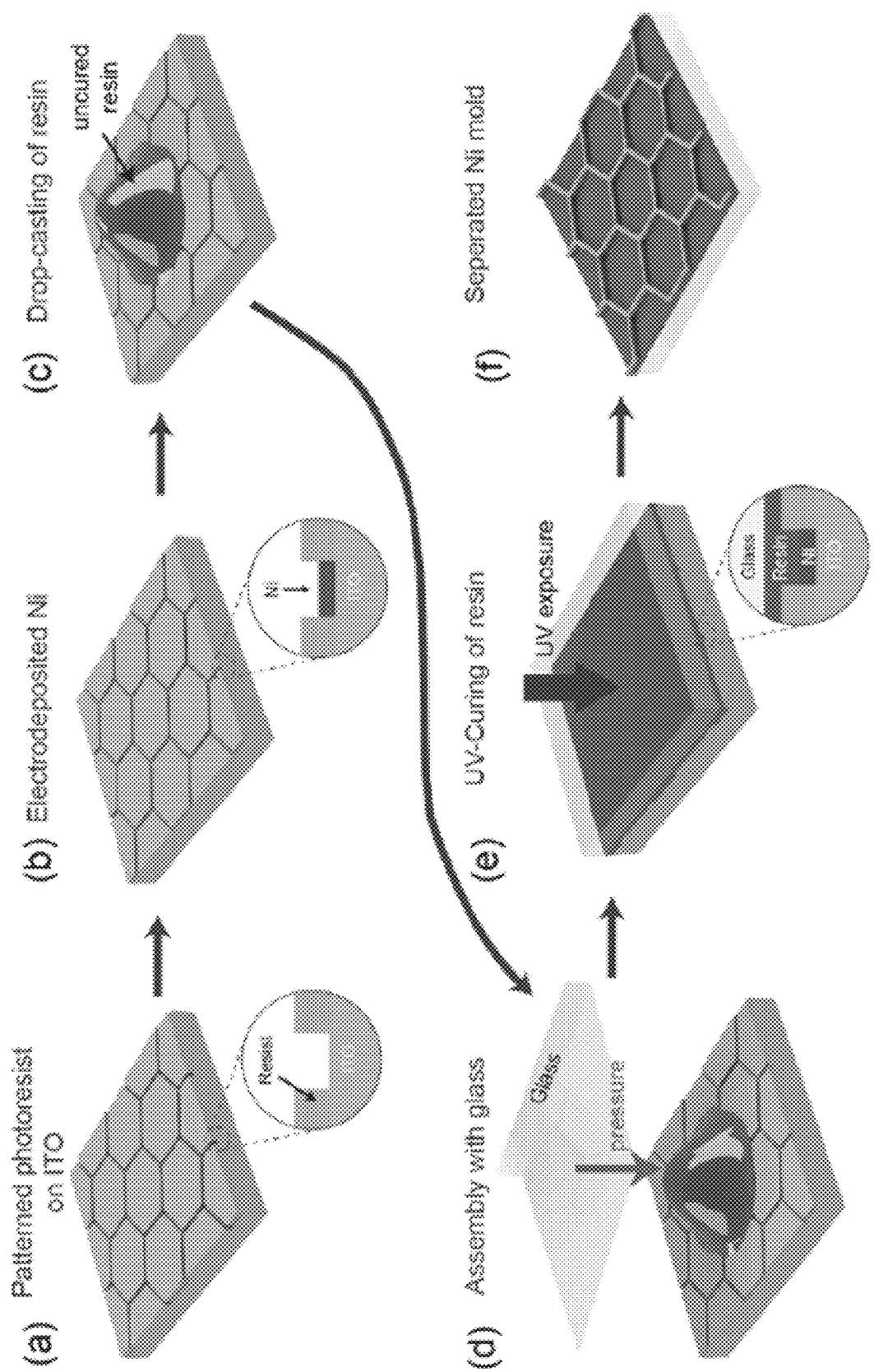
FIG. 5 is a schematic illustration of the fabrication of a Ni mold for SACN process. (a) Mesh patterns formed in a (photo)resist film on a conductive ITO glass by (photo)lithography. (b) Electrodeposition of Ni inside the trenches of the photoresist film. (c) Drop casting of a UV-curable resin on the electroplated template. (d) Covering of glass backbone and pressing the uncured resin to form a uniform layer. (e) Curing of resin by UV exposure. (f) Demolding of the Ni mold.

The contrast of selective PdNP adsorption on the SACN-mold is an aspect of the ELD process. To enhance the contrast of PdNP adsorption, a Ni pattern was selected as the adsorbing layer and a UV-curable resin was chosen as the interlayer between the Ni pattern and the glass substrate, because the Ni has high affinity to the PdNPs but the low-surface-energy nature of UV-cured resin makes it PdNP-repellent. The fabrication process of the imprint mold for the SACN process is schematically illustrated in FIG. 5. In a typical fabrication process, a resist was first spin-coated onto a conductive ITO glass substrate, and a lithographic process was conducted to create a micro-/nanoscale pattern in the resist layer using ultraviolet (UV) exposure and development or nanoimprinting (part (a) of FIG. 5). Then, Ni was deposited inside the lithographically defined exposed trenches and fill the trenches with a uniform Ni layer (part (b) of FIG. 5). Next, a UV-curable resin (NOA-61, Norland Products, USA) was poured onto the Ni-plated ITO substrate (part (c) of FIG. 5) and covered by a glass substrate with pressure to form a uniform interlayer of the resin between resist and glass substrate (part (d) of FIG. 5). After exposure to UV to fully cure the resin (part (e) of FIG. 5), the mold was manually separated from the ITO glass, with nickel pattern transferred by the resin (part (f) of FIG. 5). The mold was baked at 130° C. for 5 min before use to further increase the adhesion with Ni and harden the resin.

Figure 6:
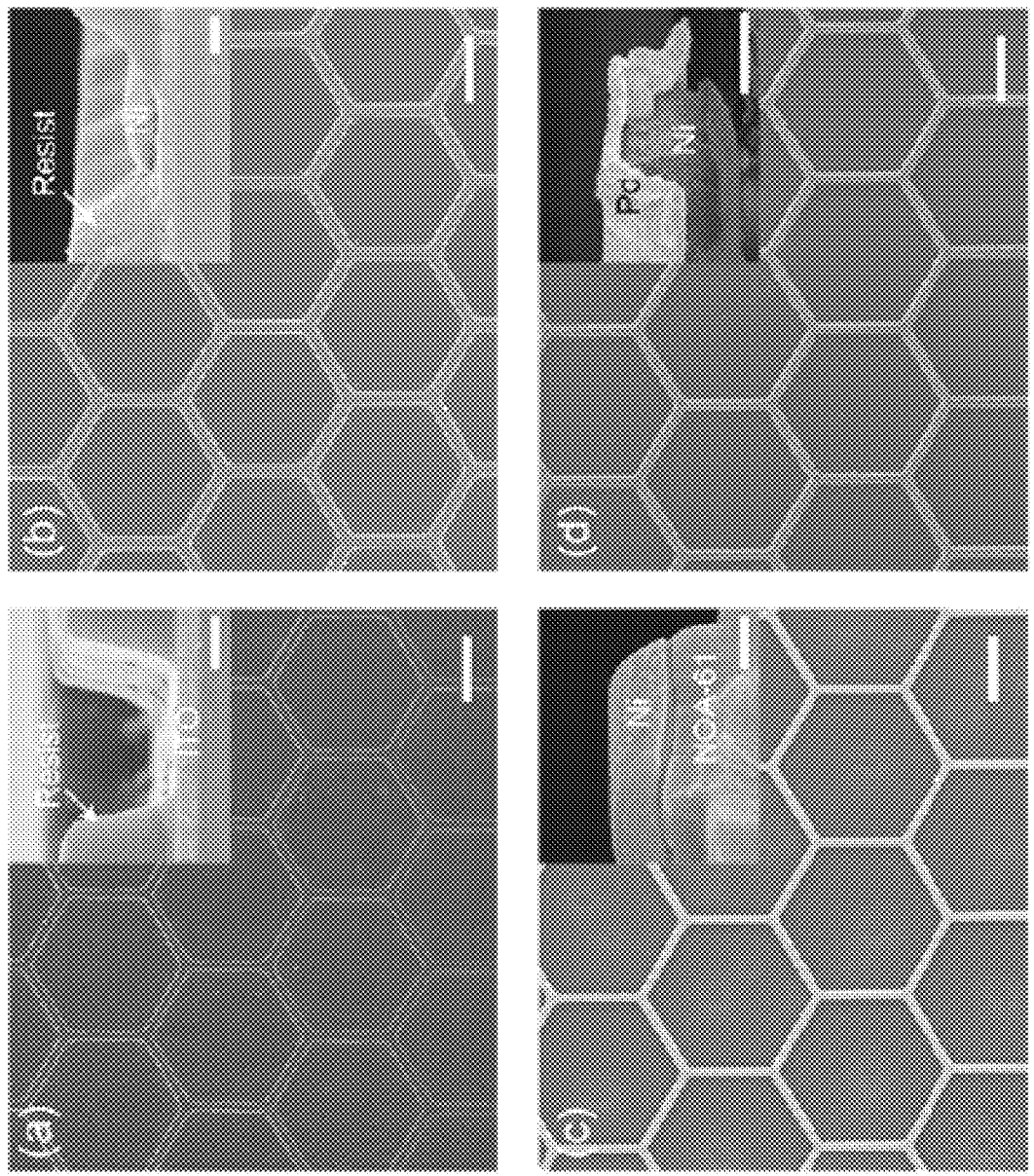
FIG. 6 depicts a morphological characterization of the SACN-mold fabrication by SEM. Top-view and (insets) cross-sectional view of (a) mesh patterns on the photoresist film, (b) electroplated nickel inside trenches on the photoresist film, (c) the Ni imprint mold, and (d) the SACN-mold, respectively. The scale bars in top-views and cross-sectional views represent 20 μm and 400 nm, respectively.
Figure 7:
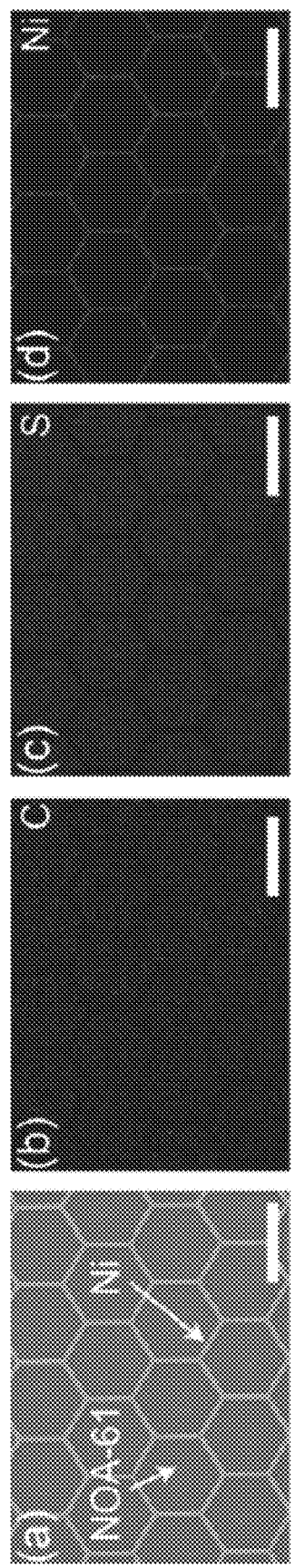
FIG. 7 depicts scanning electron microscopy (SEM) and energy-dispersive X-ray spectroscopy (EDS) analysis for a Ni mold before SACN process. (a) The SEM image with corresponding elemental mappings for (b) carbon, (c) sulfur, and (d) nickel. The scale bars represent 50 μm.
Figure 8:
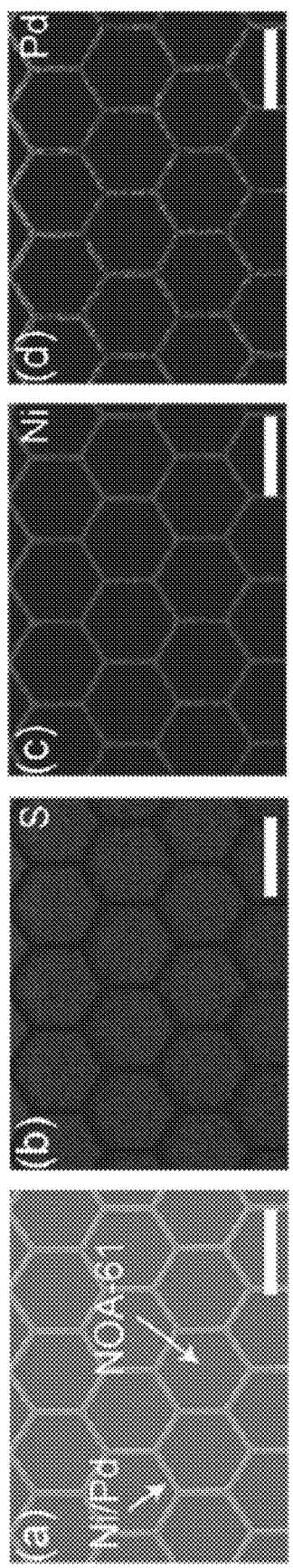
FIG. 8 depicts SEM and EDS analysis for a SACN-mold. (a) The SEM image with corresponding elemental mappings for (b) sulfur, (c) nickel, and (d) palladium. The scale bars represent 50 μm.

A 50 μm pitch micromesh patterned SACN-mold was fabricated through this process as a demonstration and further used to fabricate flexible TEs and construct electronic devices. Scanning electron microscopy (SEM) images in FIG. 6 show the morphological characterization of the Ni mold and SACN-mold at different stages of the fabrication. Part (a) of FIG. 6 displays the top and cross-sectional view SEM images of the trenches of the photoresist created using photolithography. The photoresist mesh had a 50 μm pitch, and its trench width and depth were 2.6 μm and 650 nm, respectively. Part (b) of FIG. 6 presents the electroplated Ni mesh inside the trenches on the photoresist film under a constant current density (5 mA cm−2). As evident from the image, the thickness of the Ni mesh was approximately 350 nm and could be controlled by the electroplating time. In the presented experiments, the thickness of the Ni ranges from 350 nm to 700 nm for different applications. Part (c) of FIG. 6 reveals that the Ni mesh finally transferred to a glass substrate by NOA-61 resin. Ni mesh was supported by an NOA-61 resin backbone and exhibited a protrusion structure corresponding to the original trench pattern on the photoresist film. Energy-dispersive X-ray spectroscopy (EDS) analysis also confirmed the successful transfer of electroplated Ni on the NOA-61 resin (FIG. 7). Part (d) of FIG. 6 displays the SEM image of the SACN-mold after adsorption of PdNPs, the cross-sectional view of a single PdNPs-coated Ni mesh on the SACN-mold in the inset in part (d) of FIG. 6 clearly shows a thin layer (approximately 110 nm) of PdNPs were selectively deposited on the Ni mesh, which is further confirmed by EDS analysis in FIG. 8.

2.3 Fabrication of Flexible Transparent Electrodes (TEs) Using SACN-Mold

Figure 9:
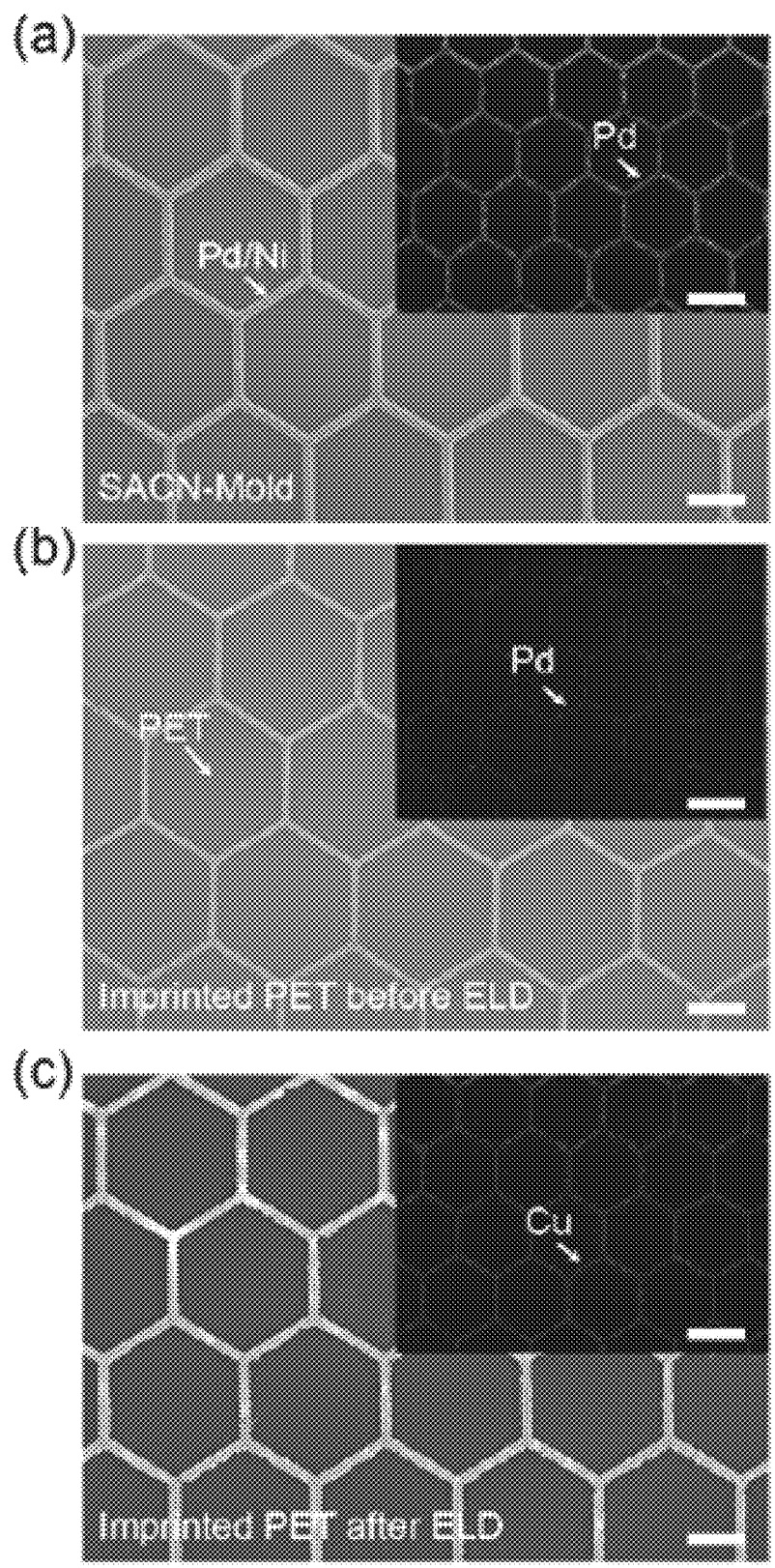
FIG. 9 depicts morphological and elemental characterizations of the Cu-mesh electrode fabrication process. SEM images and SEM-EDS images of (a) the SACN-mold, (b) the imprinted PET film with PdNPs embedded, and (c) the electroless deposited Cu mesh, respectively. (insets) SEM-EDS images showing (a-b) Pd, and (c) Cu, respectively. The scale bars in SEM and EDS images views represent 20 µm and 50 µm, respectively.
Figure 10:
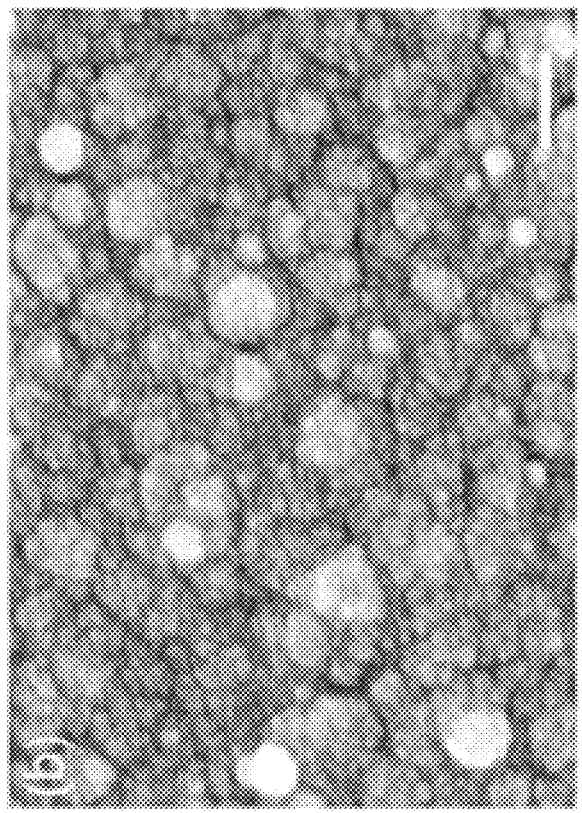
FIG. 10 depicts (a) an SEM image of a SACN-mold and (b) a zoom-in image showing the morphology of the adsorbed PdNPs. The scale bars represent 20 µm in (a) and 100 nm in (b).
Figure 10:
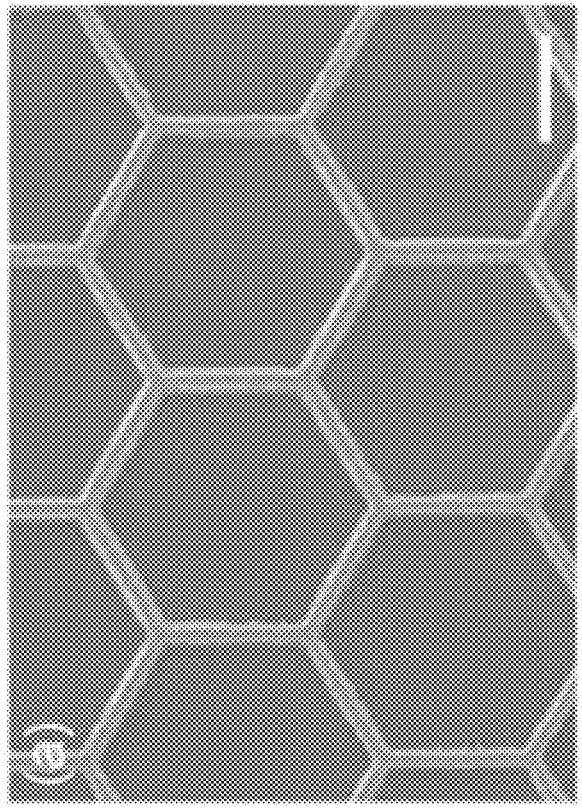
Figure 11:
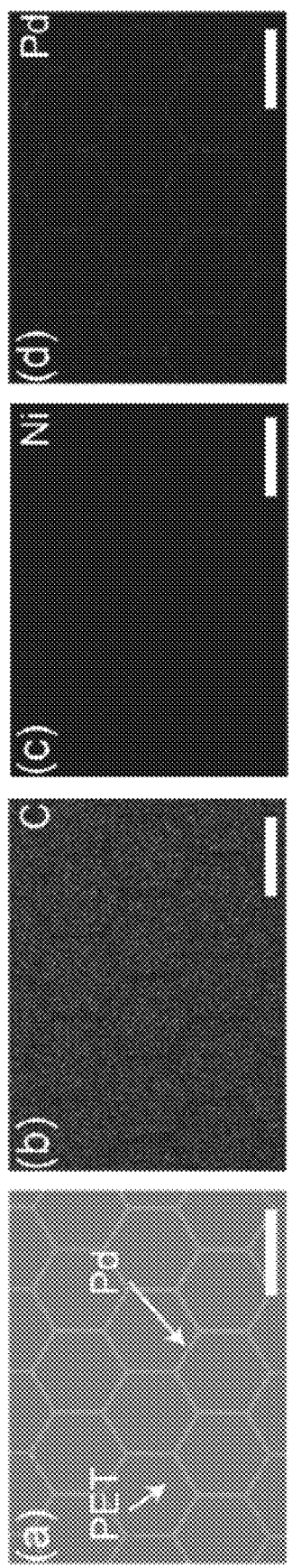
FIG. 11 depicts SEM and EDS analysis for imprint-transferred PdNPs on a polyethylene terephthalate (PET) film. (a) The SEM image with corresponding elemental mappings for (b) carbon, (c) nickel and (d) palladium. The scale bars represent 50 µm.
Figure 12:
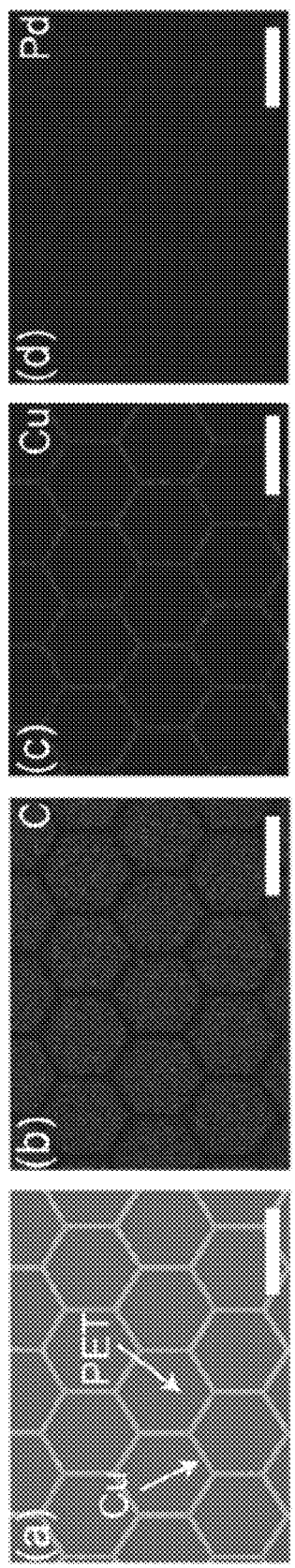
FIG. 12 depicts SEM and EDS analysis for a Cu TE. (a) The SEM image with corresponding elemental mappings for (b) carbon, (c) copper, and (d) palladium. The scale bars represent 50 µm.

Our fabrication process allows easy ELD on flexible substrates at microscale patterning resolution. A flexible TE with a Cu micromesh embedded on a PET film was fabricated through this process using the 50 μm pitch micromesh patterned SACN-mold as a demonstration. As displayed in part (f) of FIG. 3, the Cu-mesh electrode prototype shows excellent uniformity and transparency. SEM and SEM-EDS images in parts (a)-(c) of FIG. 9 show the morphological characterization of the Cu TEs at different stages of the fabrication. Part (a) of FIG. 9 displays the SEM and SEM-EDS images of the SACN-mold with PdNPs selectively adsorbed on the Ni mesh, which is proved by the SEM-EDS analysis (inset in part (a) of FIG. 9). Detailed morphology of the adsorbed PdNPs can be found in FIG. 10. The linewidth of the Ni mesh on the SACN-mold was measured to be 2.6 μm from the zoom-in SEM image. After thermal nanoimprint process, the PdNP mesh was transferred and fully embedded on the PET film from the SACN-mold, as presented in part (b) of FIG. 9. No nickel residuals were observed on imprinted PET substrate, which proves excellent durability of the SACN-mold (FIG. 11). The linewidth of the trenches was 2.6 μm, which is also corresponding to the original SACN-mold. Part (c) of FIG. 9 shows the electroless deposited Cu mesh inside the PdNP-activated mesh trenches after immersion in an electroless plating bath for 30 min, Cu was only deposited in the PdNP-activated trenches (FIG. 12). As evident from the SEM images, the Cu mesh had linewidth of approximately 3.2 μm, which is slightly wider than the linewidth of both the Ni mesh on the original imprint mold or imprinted trenches, because of the isotropic nature of the ELD process.

Figure 13:
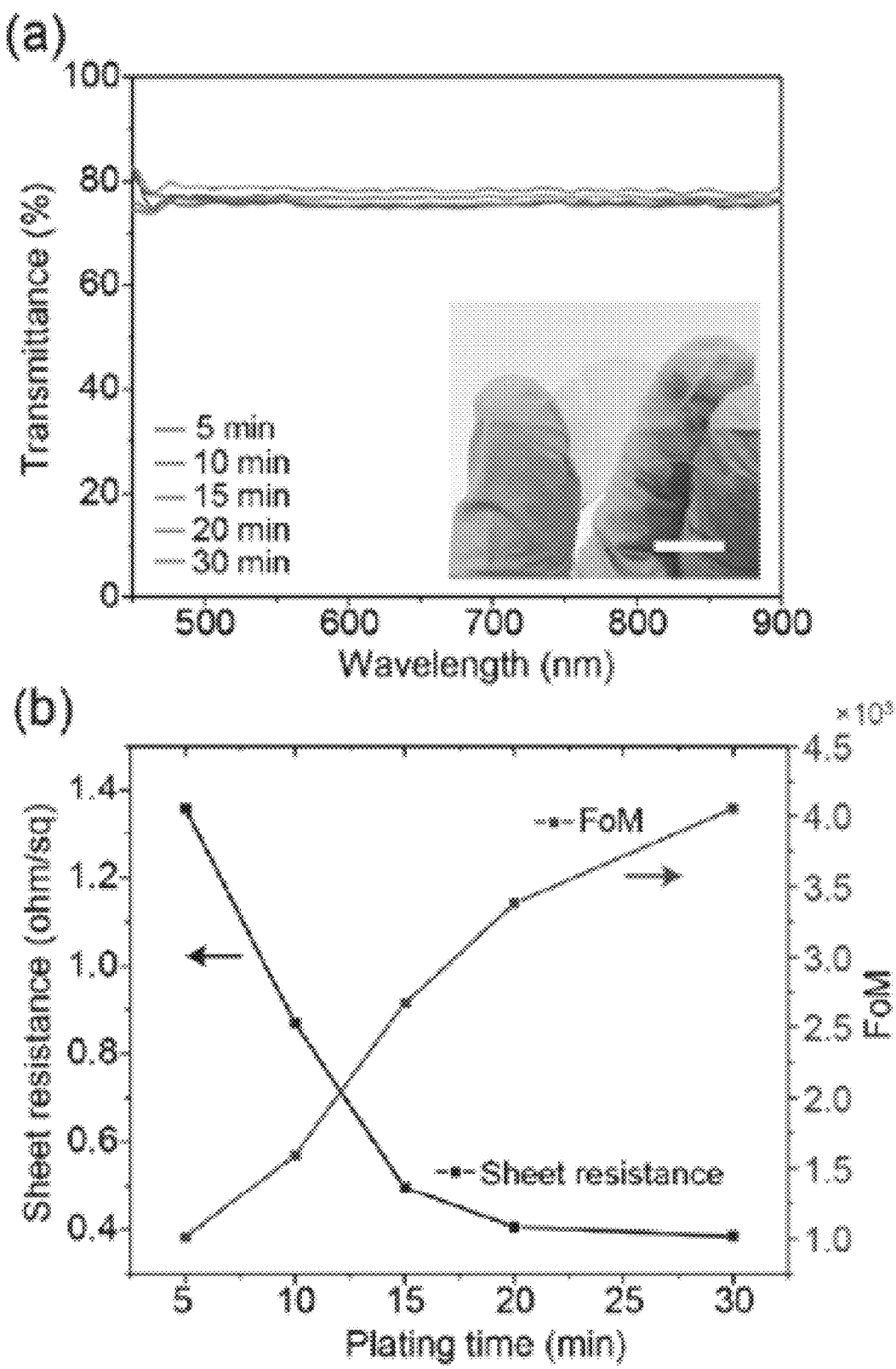
FIG. 13 depicts performance characterization of the prototype 50 µm pitch Cu-mesh electrode. (a) Transmittance spectra of the representative electrodes with plating time ranging from 5 min to 30 min. (inset) Photograph of a Cu mesh electrode. The scale bar represents 1 cm. (b) Plot of sheet resistance and FoM versus plating time of Cu mesh.

The fabrication process was further investigated by changing the electroless deposition time to fabricate Cu meshes with varying thicknesses, in which the plating temperature (40° C.) and substrate size (3×3 cm2) were maintained. Part (a) of FIG. 13 provides the transmittance of typical Cu-mesh electrodes with plating times ranging from 5 min to 30 min in the 450-900 nm wavelength range. No significant differences in the transmittance value among the Cu-mesh electrodes with different plating time were observed, which proves the excellent controllability of the deposition of metals in the lateral dimensions because the ELD process is limited only inside the PdNP-activated trenches. Meanwhile, the sheet resistance of the electrodes can be substantially reduced when the plating time is increased, as displayed in part (b) of FIG. 13. A low sheet resistance of 0.38 ohm sq−1 was observed for the 30 min Cu-mesh electrode, and the transmittance at a wavelength of 550 nm was still above 75%.

To further study how the plating time affects the overall performance of the transparent electrodes, a widely used criterion, figure of merit (FoM), namely, the ratio of the electrical conductance to the optical conductance ($\sigma_{dc}$/

σopt), was calculated for all the electrodes displayed in part (b) of FIG. 13 by using the following expression (Equation (1)):

$$FOM = \frac{\sigma_{dc}}{\sigma_{opt}} = \frac{188.5}{R_s\left(\frac{1}{\sqrt{T}} - 1\right)} \quad (1)$$

where T is the optical transmittance at a wavelength of 550 nm and Rs is the sheet resistance of the electrode. The inset of part (b) of FIG. 13 plots the FoM as a function of plating time. The presented curve indicates that the plating time has a considerable effect on the sheet resistance and hence on the value of the FoM by increasing the thickness of plated Cu mesh and enhancing its electrical conductivity. Our Cu-mesh electrode achieved FoM of more than $4\times10^3$, which is much better than that of the commercial indium tin oxide (ITO).

Figure 14:
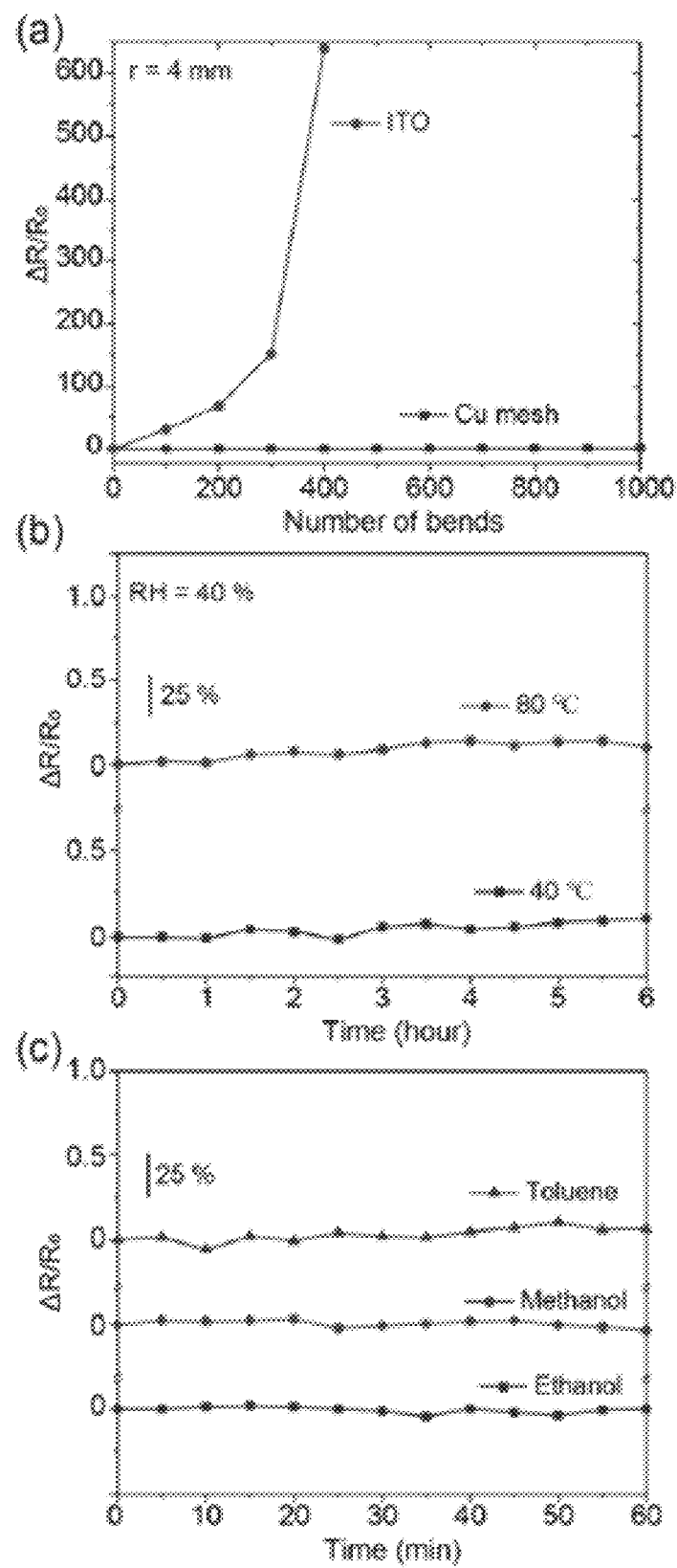
FIG. 14 depicts mechanical and environmental stabilities of the prototype flexible Cu-mesh electrode. (a) Plot of variations in the sheet resistance versus the number of cycles of repeated bending (tensile loading) to radius of 4 mm for the Cu mesh and commercial ITO/PET film, respectively. Variations in the sheet resistance during the (b) environmental and (c) chemical stability tests in various organic solvents. A COC film was used as the thermoplastic substrate in the chemical stability tests.

An advantage of the method is that the embedded nature of PdNPs greatly improves the adhesion of the Cu mesh with the substrate and enhances its stability under bending, heating, and chemical attack. Part (a) of FIG. 14 shows the variation in the sheet resistance of the Cu-mesh electrode prototype as a function of the number of bends for repeated tensile bending to a radius of 4 mm in comparison with a commercial ITO/PET film. The curves show that a lack of significant changes that occur up to 1000 bending cycles, while as a comparison, the variation in the ITO/PET is larger than 600 times after 400 bending cycles. The environmental stability of the as-fabricated flexible Cu-mesh electrode was evaluated by exposing the electrodes to high-temperature conditions (40° C. and 80° C.) and dipping them in ethanol, methanol, and toluene. Part (b) of FIG. 14 shows that after heating at 40° C. and 80° C. for 6 h, the sheet resistances of the electrode remained unchanged. Part (c) of FIG. 14 shows the variation in the sheet resistances of the electrode after dipping in ethanol, methanol, and toluene for 30 min. The results clearly indicate that no obvious changes in the sheet resistances of the electrode were observed, which also proves the superior stability of our flexible TEs under chemical attack.

Figure 15:
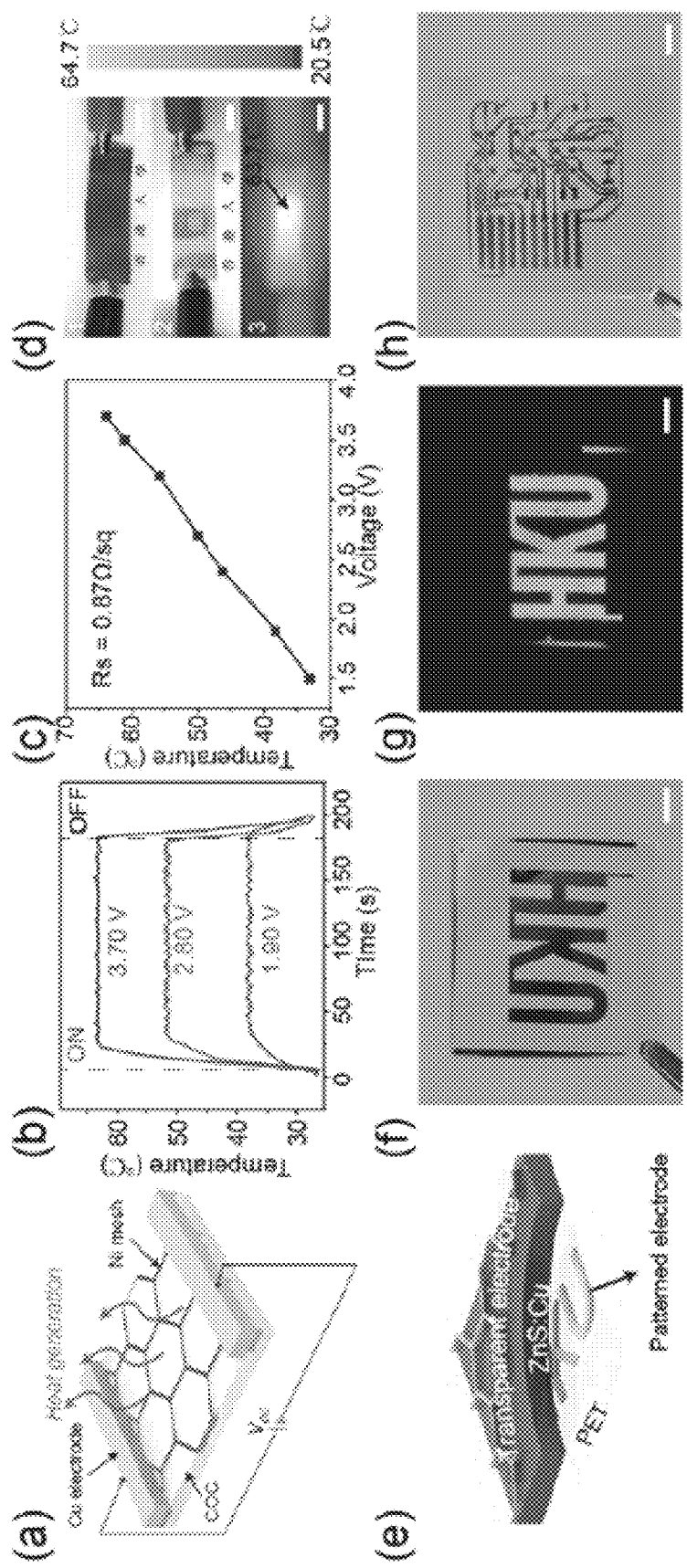
FIG. 15 depicts: (a) Schematic diagram of the transparent thin-film heater. (b) Measured temperature versus time for the heater applied with voltages of 1.90 V, 2.80 V, and 3.70 V, respectively. (c) The relationship of generated temperature and applied voltage. (d) Photographs of a temperature sensitive ink coated heater (1) before and (2) after applying external voltage of 3.70 V. (3) Thermal image of the heater after applying external voltage of 3.70 V. (e) Schematic illustration of the electroluminescent light emitter. (f) Photograph of the original SACN-mold. (g) Photograph of a flexible static electroluminescent light emitter showing 'HKU' letters. (h) Photograph of a Cu circuit fabricated on PET film. The scale bars represent 0.5 cm.

2.4 Flexible Thin-Film Heater, Electroluminescent Display, and Flexible Printed Circuits Thin-film heaters have various applications such as defrosting, defogging, thermal-based sensing, and thermal therapy. The key attention for the thin-film heater is to attain homogeneous and steady temperature distribution over large areas, fast heating and cooling rates at low power consumption. Therefore, the low sheet-resistance, large-area, and facile fabrication nature makes our TE a good candidate. A flexible thin-film heater was then constructed on an electroless deposited Ni TE as a practical application, as schematically illustrated in part (a) of FIG. 15. The DC voltage was supplied to the thin-film heater through Cu electrodes at two ends of the film, and the Joule heating performance of the film was characterized using an infrared thermal imaging camera. Part (b) of FIG. 15 displays the time-dependent temperature changes of the heater experimentally measured under different applied DC voltages of 3.70 V, 2.80 V and 1.90 V. The temperature was generated and saturated to a desired value within 20 s under the applied voltage. The environmental temperature was maintained at 23° C. in the presented experiments. A 3.70 V voltage was supplied. The relation of center temperature of the heater and the applied DC voltage is summarized in part (c) of FIG. 15. A 100-µm-thick thermochromic ink (color to clear at 43° C.) was then blade-coated on the heater to visualize the heat generation process. Part (d) of FIG. 15 presents (1) a photograph of the ink-coated heater before applying voltage and (2) a photograph and (3) infrared image after supplied with an external voltage of 3.70 V. The vanished color evident generation of heating on the film shows the rapid response of thermochromic ink due to the high efficiency of our heating device. (Note: cyclic olefin copolymer (COC, grade 5013) was used as the substrate materials and Ni TEs were chosen in thin-film heaters for better performances.)

A flexible electroluminescent display has also been constructed as another application of our selective ELD method, the configuration of the display is schematically illustrated in part (e) of FIG. 15. The flexible electroluminescent display consists of three layers, one transparent electrode layer (Cu TE), one light emitter layer (Cu doped Zn sulfide particles), and one conductive Cu layer with the desired pattern. These layers are stacked to be a sandwich structure, and when an AC voltage is supplied across the electrodes, ZnS:Cu particles will be excited and emit light. The SACN-mold used for fabricating patterned Cu layer was shown in part (f) of FIG. 15. Part (g) of FIG. 15 displays a representative image of the electroluminescent light emitter fabricated on a 3×3 cm2 PET film. As displayed in the figure, the light emitted from the display is bright and uniform because of the low sheet resistance of our TEs.

We have also fabricated an FPC to demonstrate the scalability and versatility of our method in the field of electronic device manufacturing. Part (h) of FIG. 15 show a photo of an FPC on the PET film. Compared with the commonly used methods in the FPC industry, the high-throughput, low-cost, etching-free, environmentally-friendly, and facile fabrication make our selective electroless plating method a unique candidate for the FPC industry.

2.5 Ag Nanodisk Array for Plasmonic Refractometric Sensing

Figure 16:
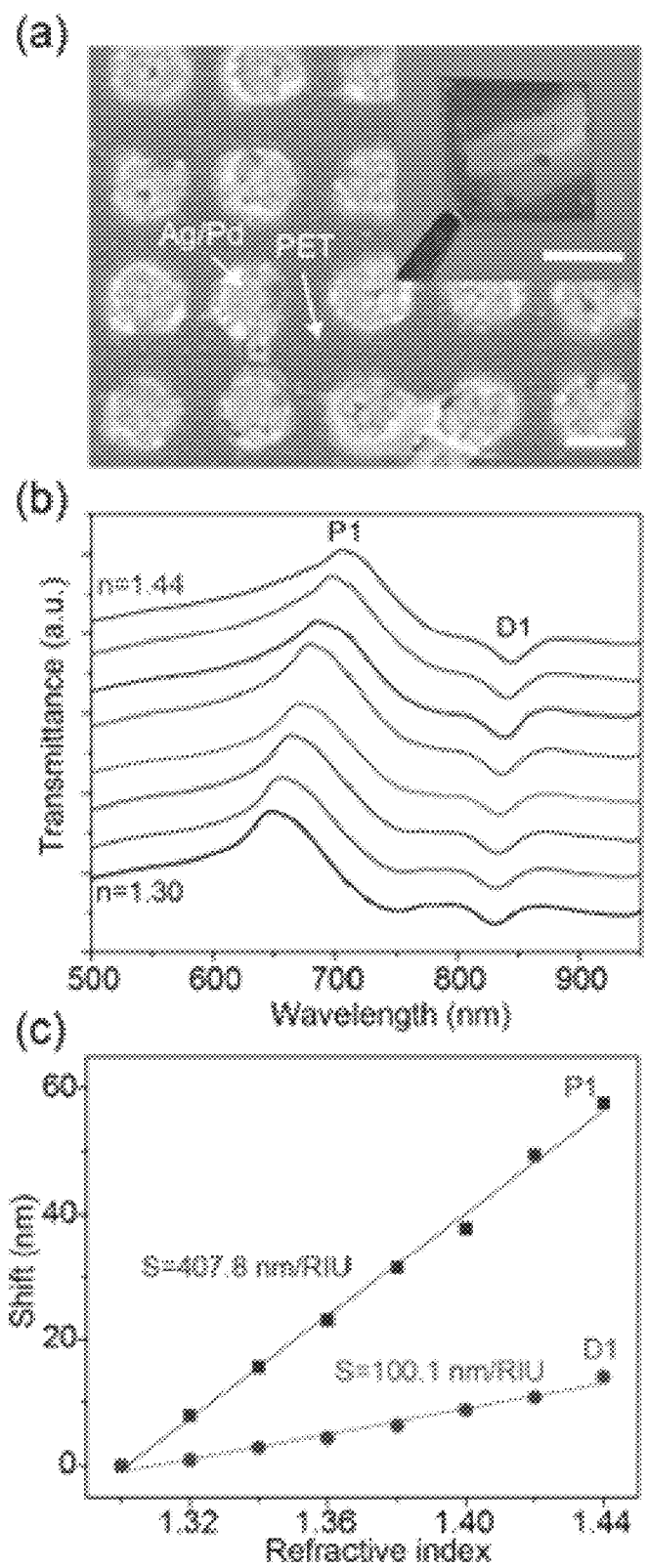
FIG. 16 depicts: (a) SEM image and (inset) photograph of a 500 nm pitch Ag nanodisk array embedded in a PET film. The scale bars in SEM image and photograph represent 200 nm and 1 cm, respectively. (b) Transmittance spectra of the Ag nanodisk array after immersing in liquids with refractive index ranging from 1.30 to 1.44. (b) Plot of spectral shift versus surrounding refractive index. The lines are linear fitted, with the refractive index sensitivities of P1 and D1 are determined to be 407.8 nm $RIU^{-1}$ and 100.1 nm $RIU^{-1}$, respectively.

Benefit from the well-developed NIL process, our fabrication process is also capable for patterning nanoscale metallic structures, and such structures have been widely used in plasmonic refractometric sensing applications. To demonstrate the dimensional versatility of our method, an Ag nanodisk array was fabricated on a PET film through this process and employed as a plasmonic refractive index sensor. A SACN-mold with approximately 50-nm-thick, 500-nm-pitch Ni nanodisk array on NOA-61 resin was used in the nanoimprint lithography process. As evident from part (a) of FIG. 16, a 500-nm-pitch Ag nanodisk array was successfully deposited on a PET film. To examine the performance of the Ag nanodisk array as a refractometric sensor, we measured the transmittance spectra of the film at normal incidence from the backside when covered with liquids with varying refractive indices. In the experiments, 10 µL of standard liquid (Cargille Labs, USA) with refractive indexes of 1.30-1.44 in steps of 0.02, were dropped on the front side of the film. As displayed in part (b) of FIG. 16, redshifts of P1 and D1 with increasing refractive indices were observed. The spectral shift of P1 and D1 versus refractive index is plotted and linear fitted in part (c) of FIG. 16. A high refractive index sensitivity of 407.8 nm RIU−1 with good linear dependence was obtained from P1. On the other hand, the sensitivity of D1 was only 100.1 nm RIU−1. The result implies that our plasmonic refractometric sensor works within the working wavelength of Si photodiodes (190-1100 nm), which could greatly reduce the cost of the configuration of measurements by employing of cheaper Si-photodiode-based spectrometers.

3. Conclusions

In summary, we demonstrated a universal fabrication process for micro- and nanoscale metallic patterns on flexible substrates using a novel imprint-transfer method to synchronously transfer patterns and PdNPs onto plastic surfaces and ELD process. An SACN-mold consisting of a PdNP-adsorbing Ni layer, a PdNP-repelling resin interlayer, a rigid glass backbone, and selectively adsorbed PdNPs were fabricated using photolithography, electrodeposition and imprint-transfer process. Metals were selectively electroless deposited on the thermoplastic film catalyzed by the thermal imprint-transferred PdNPs. Flexible TEs with good electrical conductivity and optic transmittance were fabricated with this method as practical demonstrations. A high FoM value of $4\times10^3$ was demonstrated on the Cu TE prototypes. Excellent mechanical, chemical, and environment stabilities were observed on the prototype electrodes. Flexible electroluminescent light emitters and FPCs were constructed with TEs fabricated using this method. Moreover, a plasmonic refractometric sensor with excellent performance was constructed on the electroless deposited Ag nanodisk array. The developed fabrication process was solution-processed, etching-free, and environmentally-friendly that could be adapted for the high-throughput and low-cost manufacturing of various electronic, optoelectronic, and plasmonic devices.

4. Experimental

4.1 Materials

PET films were purchased from Dongguang Boyuan Plastics (Dongguan, China). COC films (Grade 5013) were bought from TOPAS (Frankfurt, Germany). Silver nitrate, ammonium chloride, and palladium chloride were all AR grade obtained from Sinopharm Chemical Reagent (Shanghai, China). Copper sulfate pentahydrate, nickel sulfate heptahydrate, potassium sodium tartrate, ethylenediaminetetraacetic acid disodium, sodium hydroxide, 2,2'-bipyridyl, and potassium ferrocyanide were all AR grade purchased from Acros Organics (New Jersey, USA). Formaldehyde, hydrogen peroxide (30%), sodium hypophosphite, sodium citrate, PVP (M.W. 8000) and ammonium chloride were AR grade obtained from J&K Chemicals (Shenzhen, China). Zonyl FSN was purchased from Dupont (Wilmington, USA).

4.2 Preparation of PdNPs

For preparation of PdNPs, 900 mg ammonium chloride was first dissolved in 50 mL deionized water by magnetic stirring, then 300 mg palladium chloride was added to the solution until completed dissolving. Afterwards, 940 mg PVP (M.W. 8000) was added to the solution until a homogenous solution was formed (Solution A). 600 mg ascorbic acid was then dissolved in another 50 mL deionized water (Solution B). Finally, solution B was added dropwise into solution A at a rate of 5 mL min−1 under magnetic stirring, and the mixture was stirred for another 4 h. See J. Cal, C. Zhang, A. Khan, L. Wang and W.-D. Li, *ACS Appl. Mater. Interfaces*, 2018, 10, 28754-28763, which is incorporated herein by reference in its entirety.

4.2 Fabrication of the Imprint Molds for SACN

The indium tin oxide (ITO) glass substrates were first cut into 3×3 cm² pieces. These ITO glass pieces were cleaned with a cotton swab and rinsed thoroughly in deionized water, and then treated with oxygen plasma (Potentlube, China) for 5 min. The samples were then further cleaned by ultrasonication in acetone and isopropanol for 300 s before dried under nitrogen flow. Then a 945-nm-thick layer of photoresist (AZ 1500, MicroChemicals, USA) was spin-coated on the ITO substrate and baked under 110° C. for 1 min. Thereafter, the photoresist was exposed using a URE-2000/35 UV mask aligner (Chinese Academy of Sciences, China) for an exposure dose of 55 mJ cm$^{-2}$ at 365 nm wavelength. The photoresist was then developed in an AZ 351B developer (Clariant, Switzerland) for 1 min. The samples were finally rinsed in deionized water and dried under nitrogen flow. For the imprint mold with nanodisk array, a residual-layer-free thermal nanoimprint lithography process was conducted on the ITO glass substrate instead.

Ni is deposited on the trenches of lithographically defined patterns on ITO glass substrates through an electrodeposition process. First, the patterned substrate is treated with an anti-sticking agent (perfluorodecyltrichlorosilane, Sigma Aldrich, USA) to reduce the adhesion between electrode-posited Ni and ITO. Then, a Ni electroplating solution (Caswell, USA) is used for the deposition of Ni. A Keithley 2400 SourceMeter is used to supply 5 mA cm−2 current density during electrodeposition process. A two-electrode electrodeposition setup with the ITO glass as the anode and a platinum-coated titanium grid as the cathode. Afterward, the sample was thoroughly rinsed with deionized water and dried by nitrogen flow.

0.02 g NOA-61 UV-curable resin was then dropped onto the sample and covered with an oxygen plasma-cleaned glass substrate with area of 3×3 cm². A gentle pressure was then applied on the stack to form a uniform interlayer of the resin between resist and glass substrate. Thereafter, the stack was exposed to an UV (405 nm, 600 mJ cm$^{-2}$) to fully cure the resin. Finally, the imprint mold was separated from the ITO glass manually, with nickel pattern transferred by the resin.

4.4 Thermal Nanoimprint Transfer of PdNPs

The imprint mold was first immersed in a 300 mM PdNP colloidal solution at 40° C. for 5 min to adsorb PdNPs for preparation of the SACN-mold (In case of fabrication of nanodisk array, the immersion time was reduced to 20 s). Then the SACN-mold was rinsed in deionized water and dried under nitrogen flow. A thermal nanoimprint process was used to synchronously transfer the pattern and PdNPs onto a 200-µm-thick PET film using a home-built nanoimprint platform consisting of a hydraulic press (Specac Ltd., UK), electrically heated platens with a temperature controller (Specac Ltd., UK), and a chiller (Grant Instruments, UK). The template/substrate stack was heated to 105° C. (150° C. for COC films) for 5 min with an imprinting pressure of approximately 0.5 MPa to press the template and the PET film. Afterward, the heated stack was cooled down to the demolding temperature of 40° C., and the PET film was peeled off from the glass template after releasing the pressure, leaving PdNPs and the pattern transferred onto the PET film.

4.5 Electroless Deposition of Cu, Ni, and Ag

The PET film with imprint-transferred PdNPs was immersed in Cu electroless plating bath at 40° C. for 5-30 min, Ni electroless plating bath at 55° C. for 5 min, or Ag electroless plating bath at room temperature for 30 s to 3 min for metallization. After electroless plating, the samples were rinsed in deionized water and dried under nitrogen flow. The samples were heat-treated at 60° C. for 30 min to relief the internal stress, leading to better adhesion and stability of the metals.

The Cu electroless plating bath comprised of copper sulfate pentahydrate (12 g L$^{-1}$), nickel sulfate heptahydrate (1.28 g L$^{-1}$), potassium sodium tartrate (11.2 g L$^{-1}$), ethylenediaminetetraacetic acid disodium (15.6 g L$^{-1}$), sodium hydroxide (14 g L$^{-1}$), 2,2'-bipyridyl (0.4 mg L$^{-1}$), potassium ferrocyanide (0.6 mg L$^{-1}$), Dupont Zonyl FSN (0.5 mL L$^{-1}$), and formaldehyde (15 mL $L^{-1}$). The Ni electroless plating bath comprised of nickel sulfate heptahydrate (30 g $L^{-1}$), sodium hypophosphite (28 g $L^{-1}$), sodium citrate (35 g $L^{-1}$), ammonium chloride (30 g $L^{-1}$), Dupont Zonyl FSN (0.5 mL $L^{-1}$), the pH value of the plating bath was adjusted by ammonia to be approximately 8.0. The Ag electroless plating bath comprised of silver nitrate (2 g $L^{-1}$), ethylenediaminetetraacetic acid disodium (0.2 g $L^{-1}$), and formaldehyde (1 mL $L^{-1}$). Silver nitrate and ethylenediaminetetraacetic acid disodium were first dissolved in a suitable amount of deionized water; then silver nitrate solution was gently poured into ethylenediamine tetraacetic acid disodium solution while stirring. Afterwards, 25% w.t. ammonia was added to the mixed solution until it became clear again. Then 1 mL $L^{-1}$ formaldehyde was added to the solution, and the volume of the solution was adjusted to be 1 L by deionized water. The Ag electroless plating bath was used immediately after preparation.

4.6 Fabrication of Electroluminescent Displays

The 'HKU'-letter pattern was created on a PET film imprinted using the SACN-mold. Then the patterned sample was immersed in Cu electroless plating bath for 15 min for metallization. Afterward, electroluminescent ZnS:Cu particles (Shanghai KPT, China) were mixed with a polybutene glue with a mass ratio of 1.5:1. Then the mixture was spin-coated onto the substrate at 500 rpm for 15 s and baked in an oven at 60° C. for 10 min to solidify the emission layer partially. Finally, a Cu TE was attached to the emission layer with pressure and left the assembled stack in an oven at 60° C. for 12 h to complete the fabrication of the electroluminescent light emitter. The electroluminescent light emitter was driven by a DG2-3-T AC voltage driver (Shanghai KPT, China).

4.7 Morphological Characterizations

The morphology of the samples was characterized using scanning electron microscopes including LEO-1530 Gemini (Zeiss, Germany), S-4800N (Hitachi, Japan), and S-3400N (Hitachi, Japan). EDS analysis was performed by S-3400N and S-4800N scanning electron microscopes. A CM-100 tunneling electron microscope (Philips, Netherlands) was used to investigate the morphology of PdNPs.

4.8 Measurement of the Transmission Spectra

All spectra were taken on an ultraviolet/visible/near-infrared spectrometer (HR2000+, Ocean Optics, USA). All transmittance values presented in this paper are normalized to the absolute transmittance through the bare PET film.

4.9 Performance Measurements

The sheet resistances of the TEs were measured using a four-probe method to eliminate the contact resistance. During the measurement, four probes were placed on two silver paste-covered edges of a square sample, and the resistance was recorded with a Keithley 2400 SourceMeter (Keithley, USA). During the measurement of the repetitive bending or stretching process, the sample was fixed to a home-built moving stage controlled using an Arduino microcontroller. For thin-film heater application, the DC voltage was supplied by the Keithley 2400 as a DC power supply to the heater through two Cu adhesive tapes at the film edge. The temperature of the film was measured using a FLIR ONE infrared thermal imager (FLIR Systems, USA).

4.10 Measurement of Refractive Index Sensitivity

The index sensitivity was determined by dropping 10 µL of standard liquid on the same sample and recording the transmission spectra. The standard liquids (Cargille Labs, USA) have refractive indices of 1.30-1.44 in steps of 0.02. After each measurement, the sample was thoroughly rinsed with isopropanol and dried under nitrogen flow.

The invention claimed is:

1. A method for selective metallization, the method comprising:
    selectively adsorbing catalytic nanoparticles onto an imprint mold to form a selectively adsorbed catalytic nanoparticle (SACN) mold;
    using the SACN mold in an imprinting process to synchronously transfer a pattern and the catalytic nanoparticles onto a film;
    separating the film from the SACN mold; and
    selectively depositing metal onto the film based on the pattern transferred to the film.

2. The method according to claim 1, wherein the imprint mold comprises microscale and/or nanoscale structures corresponding to the pattern.

3. The method according to claim 1, wherein the pattern is a mesh pattern.

4. The method according to claim 1, wherein the pattern corresponds to a nanodisk array.

5. The method according to claim 1, wherein the imprint mold comprises a glass backbone, a resin interlayer, and a metal layer.

6. The method according to claim 5, wherein the metal layer comprises nickel (Ni).

7. The method according to claim 5, wherein the metal layer corresponds to the pattern.

8. The method according to claim 5, wherein the metal layer is adsorptive relative to the nanoparticles and the resin interlayer is repellent relative to the nanoparticles.

9. The method according to claim 1, wherein the nanoparticles comprise palladium nanoparticles (PdNPs), platinum nanoparticles, silver nanoparticles, nickel nanoparticles or nickel-cobalt nanoparticles.

10. The method according to claim 1, wherein selectively adsorbing catalytic nanoparticles onto the imprint mold to form the SACN mold comprises immersing the imprint mold in a nanoparticle solution.

11. The method according to claim 1, wherein the film is a thermoplastic film.

12. The method according to claim 1, wherein selectively depositing metal onto the film based on the pattern transferred to the film comprises:
    immersing the film in one or more electroless plating baths.

13. The method according to claim 1, further comprising:
    forming the imprint mold, wherein forming the imprint mold comprises:
        coating a resist film onto a first glass substrate;
        generating the pattern in the resist film;
        depositing an adsorptive metal based on the pattern;
        forming a resin interlayer and a glass backbone by adding a resin and covering the resin with a second glass substrate;
        removing the first glass substrate and the resist film.

14. The method according to claim 13, wherein forming the imprint mold further comprises:
    curing the resin interlayer.

15. The method according to claim 13, wherein the resist film is a photoresist film, and wherein generating the pattern in the resist film comprises a lithographic process.

16. The method according to claim 13, wherein forming the imprint mold further comprises:
    baking the imprint mold.

* * * * *